(12) United States Patent
Oue et al.

(10) Patent No.: US 7,952,102 B2
(45) Date of Patent: May 31, 2011

(54) DISPLAY DEVICE AND MANUFACTURING METHOD THEREOF

(75) Inventors: Eiji Oue, Mobara (JP); Toshio Miyazawa, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 226 days.

(21) Appl. No.: 12/392,120

(22) Filed: Feb. 25, 2009

(65) Prior Publication Data

US 2009/0224258 A1 Sep. 10, 2009

(30) Foreign Application Priority Data

Feb. 29, 2008 (JP) ................. 2008-049882

(51) Int. Cl.
 H01L 29/04 (2006.01)
 H01L 29/15 (2006.01)
 H01L 31/036 (2006.01)
 H01L 29/10 (2006.01)
 H01L 31/0376 (2006.01)
 H01L 31/20 (2006.01)
 H01L 31/062 (2006.01)
 H01L 31/113 (2006.01)

(52) U.S. Cl. ...... 257/72; 257/59; 257/291; 257/E29.151

(58) Field of Classification Search ............ 257/59, 257/72, 291, E29.151

See application file for complete search history.

(56) References Cited

U.S. PATENT DOCUMENTS

| | | | | |
|---|---|---|---|---|
| 6,566,178 B2 * | 5/2003 | Shih | ............... | 438/163 |
| 6,586,766 B2 * | 7/2003 | Yamazaki et al. | ............... | 257/57 |
| 6,909,114 B1 | 6/2005 | Yamazaki | | |
| 7,038,283 B2 * | 5/2006 | Yanai et al. | ................... | 257/392 |
| 7,256,457 B2 | 8/2007 | Hotta | | |
| 7,387,920 B2 * | 6/2008 | Cho | .............. | 438/163 |
| 7,674,658 B2 * | 3/2010 | Li et al. | ........................ | 438/149 |
| 7,700,495 B2 * | 4/2010 | Doi et al. | ....................... | 438/733 |
| 2004/0017365 A1 | 1/2004 | Hatano et al. | | |
| 2004/0048422 A1 * | 3/2004 | Kurosawa et al. | ........... | 438/151 |
| 2005/0017241 A1 * | 1/2005 | Zhang | ............. | 257/59 |
| 2005/0263773 A1 * | 12/2005 | Nam | .............. | 257/72 |
| 2007/0230235 A1 * | 10/2007 | Abe et al. | ...................... | 365/151 |
| 2007/0262403 A1 * | 11/2007 | Tsurume | ...................... | 257/428 |
| 2008/0164464 A1 * | 7/2008 | Kato | ............... | 257/40 |
| 2008/0210945 A1 * | 9/2008 | Miyairi | .......................... | 257/66 |

* cited by examiner

*Primary Examiner* — Ida M Soward

(74) *Attorney, Agent, or Firm* — Antonelli, Terry, Stout & Kraus, LLP.

(57) ABSTRACT

In a display device which forms thin film transistors on a substrate, the thin film transistor includes an n-type thin film transistor and a p-type thin film transistor, a gate electrode of one thin film transistor out of the n-type thin film transistor and the p-type thin film transistor forms a metal layer made of a material different from the gate electrode on a gate-insulation-film side thereof, and an LDD layer is formed over a semiconductor layer of at least one of the n-type thin film transistor and the p-type thin film transistor.

3 Claims, 24 Drawing Sheets

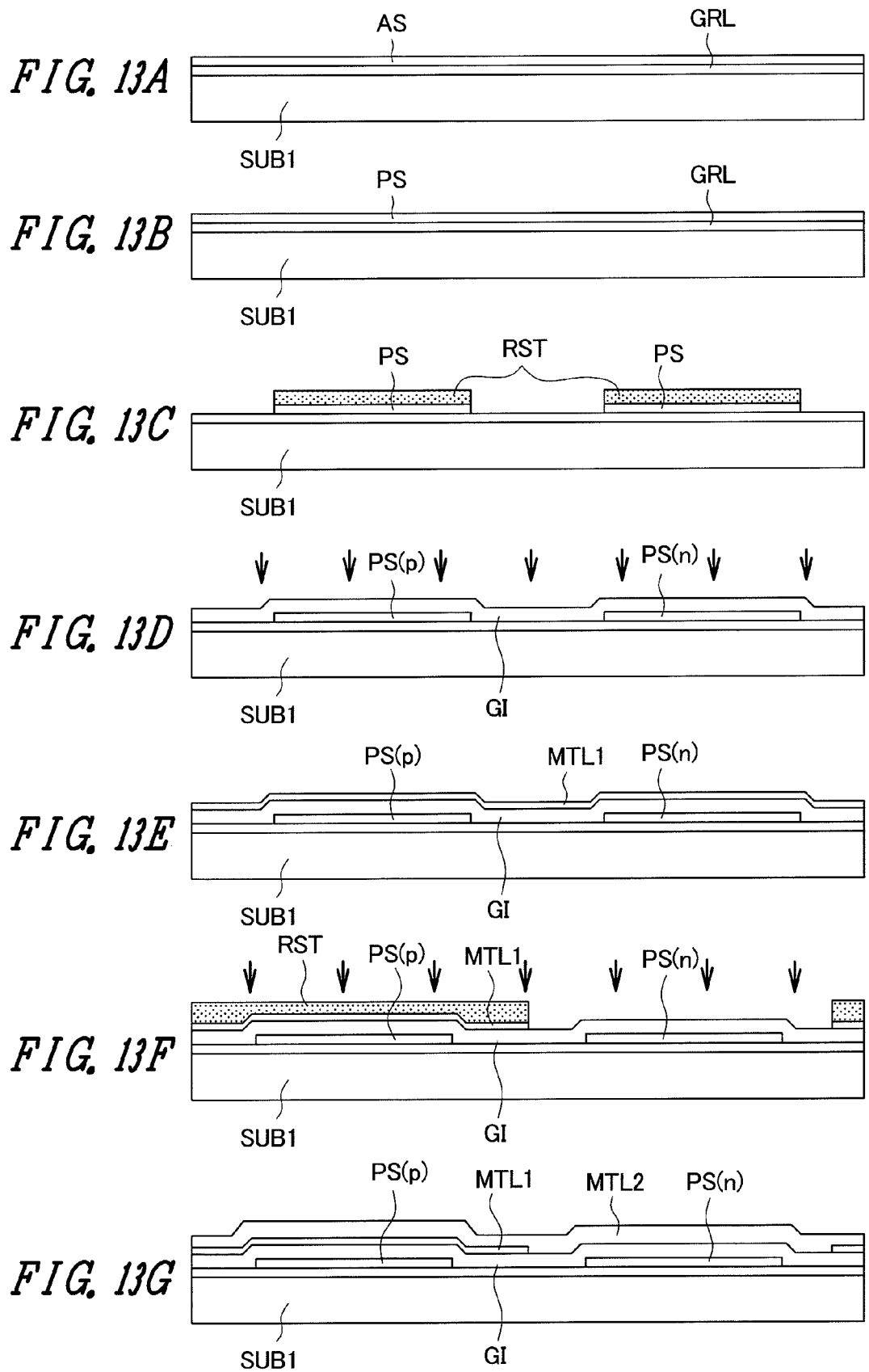

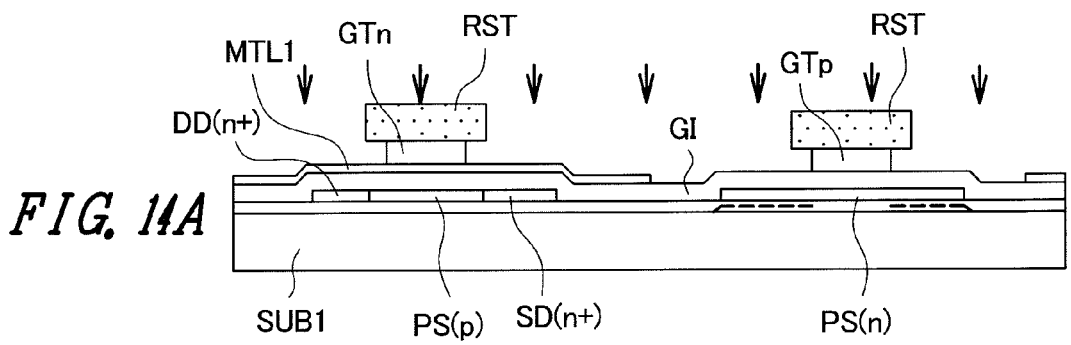
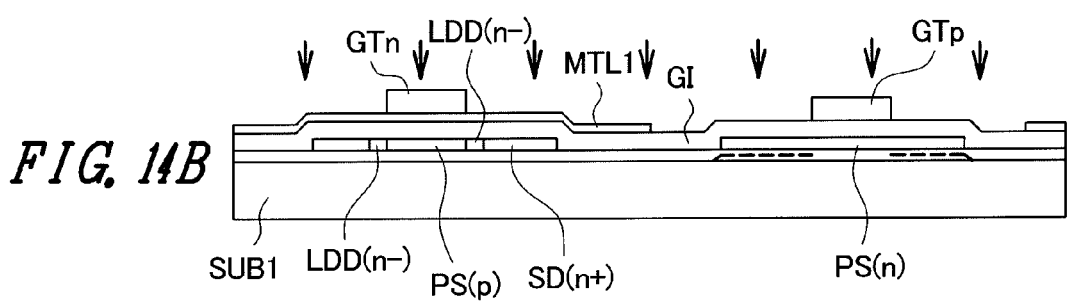
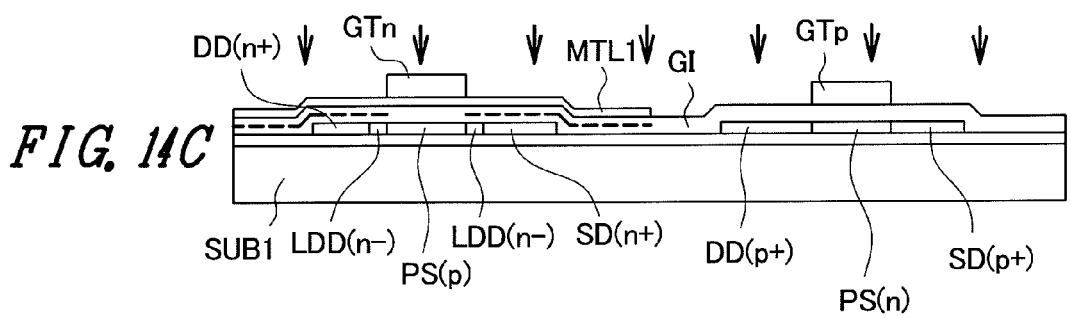
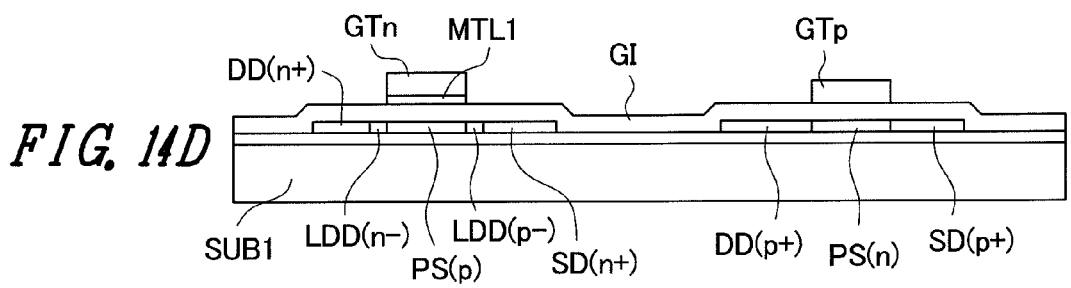
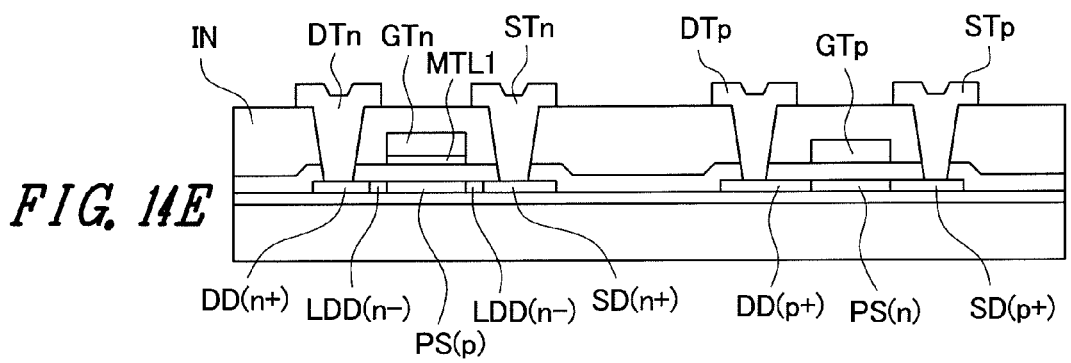

DISPLAY DEVICE AND MANUFACTURING METHOD THEREOF

BACKGROUND OF THE INVENTION

1. Field of the Invention

The present invention relates to a display device and a manufacturing method thereof, and more particularly to a display device in which thin film transistors are formed over a substrate and a manufacturing method thereof.

2. Description of the Related Art

An active-matrix-type display device includes pixels which are arranged in a matrix array. The respective pixels are sequentially selected in the columnar direction by supplying a scanning signal to signal lines (gate signal lines) each of which is used in common by the respective pixels which are arranged in the row direction and, at timing of such sequential selection, a video signal is supplied to the respective pixels arranged in the columnar direction through signal lines (drain signal lines) each of which is used in common by the respective pixels.

For this end, each pixel includes a thin film transistor for fetching the video signal from the drain signal line into the pixel (pixel electrode) in response to the supply of the scanning signal.

Further, on the same substrate on which the pixels are formed, a drive circuit which supplies the scanning signal to the gate signal lines or the video signal to the drain signal lines is formed, and the drive circuit is constituted of a circuit which includes a plurality of thin film transistors. The drive circuit also includes a CMOS thin film transistor which is formed by complimentarily connecting an n-type thin film transistor and a p-type thin film transistor, for example.

Here, the thin film transistor is formed as a so-called MIS-type transistor or a so-called MOS-type transistor having the following constitution, for example. That is, the MIS-type transistor or the MOS-type transistor is constituted such that a gate insulation film is formed so as to cover a semiconductor layer, a gate electrode is formed on an upper surface of the gate insulation film in a state that the gate electrode strides over the semiconductor layer, and a pair of electrodes (a drain electrode and a source electrode) which are arranged to face each other in an opposed manner with a region (channel region) above the gate electrode sandwiched therebetween is formed on an upper surface of the semiconductor layer.

Further, there has been known a thin film transistor which forms a high-density-impurity layer constituting a contact layer on portions of the semiconductor layer which are connected to the respective electrodes, and forms a low-density-impurity layer of the same conductive type on a channel region side.

The low-density-impurity layer is referred to as a so-called LDD (Lightly Doped Drain) layer and has an effect of alleviating the concentration of an electric field between the contact layer and the gate electrode.

A display device having such a thin film transistor is disclosed in JP-A-2004-54168 (patent document 1), for example.

SUMMARY OF THE INVENTION

However, with respect to the display device disclosed in patent document 1, the manufacture of an n-type thin film transistor and a p-type thin film transistor requires a cumbersome manufacturing process.

That is, although the formation of the contact layer in the semiconductor layer of the n-type thin film transistor requires an n-type-impurity doping step and the formation of the contact layer in the semiconductor layer of the p-type thin film transistor also requires a p-type-impurity doping step, at the time of performing such operations, it is necessary to mask at least a semiconductor layer of another different conductive thin film transistor using a photoresist film which is selectively formed by a so-called photolithography technique.

The same goes for a case in which the LDD layer is formed in at least one of the n-type thin film transistor and the p-type thin film transistor.

It is an object of the present invention to provide a display device which can realize the reduction of the number of steps of a manufacturing process.

It is another object of the present invention to provide a manufacturing method of a display device which can realize the reduction of the number of steps of a manufacturing process.

To briefly explain typical inventions among inventions disclosed in this application, they are as follows.

(1) According to a first aspect of the present invention, there is provided a display device which includes a plurality of n-type thin film transistors and a plurality of p-type thin film transistors, for example, wherein the n-type thin film transistor and the p-type thin film transistor each have a semiconductor layer, a gate insulation film and a gate electrode, the semiconductor layer includes a channel region, a source region and a drain region, the gate insulation film is formed over the semiconductor layer, the gate electrode is formed over the gate insulation film in a state that the gate electrode strides over the semiconductor layer, the gate electrode of one thin film transistor out of the n-type thin film transistor and the p-type thin film transistor forms a metal layer made of a material different from a material of the gate electrode on a gate-insulation-film side thereof, and at least one of the n-type thin film transistor and the p-type thin film transistor is configured such that a region which exhibits impurity concentration lower than the source region and the drain region is formed between the channel region and the source region and between the channel region and the drain region.

(2) According to a second aspect of the present invention, there is provided a manufacturing method of a display device which forms a plurality of n-type thin film transistors and a plurality of p-type thin film transistors on a substrate for example, the manufacturing method of the display device including the steps of: forming a first semiconductor layer of the n-type thin film transistor and a second semiconductor layer of the p-type thin film transistor over the substrate; forming an insulation film which covers the first semiconductor layer and the second semiconductor layer; forming a metal layer which covers one semiconductor layer out of the first semiconductor layer and the second semiconductor layer on the insulation film; forming a first gate electrode in a region on the metal layer which overlaps with said one semiconductor layer and forming a second gate electrode in a region on the metal layer which overlaps with another semiconductor layer different from said one semiconductor layer; forming a first impurity region by injecting n-type impurity into the first semiconductor layer; forming a second impurity region by injecting p-type impurity into the second semiconductor layer; forming a third impurity region which exhibits impurity concentration lower than the first impurity region and the second impurity region on at least one of the first semiconductor layer and the second semiconductor layer; and etching the metal layer in a region other than a region which overlaps with the first gate electrode.

(3) The manufacturing method of a display device according to the present invention also has a feature that, for example, on the premise of the constitution (2), the step of forming the first semiconductor layer and the second semiconductor layer includes a first injection step in which n-type impurity is injected and a second injection step in which p-type impurity is injected, and out of the first injection step and the second injection step, one step is a step before the step of forming the metal layer and another step is a step after the step of forming the metal layer.

(4) The manufacturing method of a display device according to the present invention also has a feature that, for example, on the premise of the constitution (2), the step of forming the first semiconductor layer and the second semiconductor layer includes a first injection step in which n-type impurity is injected and a second injection step in which p-type impurity is injected, and the step of forming the metal layer includes a step of forming a first metal film over the insulation film, a step of forming a resist film over a portion of the first metal film, a step of etching a region other than the portion of the first metal film, and a step of removing the resist film, and out of the first injection step and the second injection step, one step is a step before the step of removing the resist film and another step is a step after the step of removing the resist film.

(5) The manufacturing method of a display device according to the present invention also has a feature that, for example, on the premise of the constitution (2), the step of forming the first gate electrode and the second gate electrode includes a step of forming a second metal film, a step of forming a resist film over a portion of the second metal film, a step of etching the second metal film using the resist film as a mask, and a step of removing the resist film, a region of the second metal film which does not overlap with the resist film as viewed in a plan view and a portion of the second metal film which overlaps with the resist film as viewed in a plan view are etched in the step of etching the second metal film, the step of forming the first impurity region and the step of forming the second impurity region are steps before the step of removing the resist film, and the step of forming the third impurity region includes a step of injecting impurity after the step of removing the resist film.

(6) The present invention also has a feature that, for example, on the premise of any one of the constitutions (1) to (5), the semiconductor layer is made of polysilicon.

(7) The present invention has a feature that, for example, on the premise of any one of the constitutions (1) to (6), the metal film is made of titanium.

The present invention is not limited to the above-mentioned constitutions and various modifications are conceivable without departing from the technical concept of the present invention.

According to the display device of the present invention, it is possible to provide the constitution which can realize the reduction of the number of steps of a manufacturing process. Further, according to the manufacturing method of the display device of the present invention, it is possible to reduce the number of steps of a manufacturing process.

BRIEF DESCRIPTION OF THE DRAWINGS

FIG. 13A to FIG. 13G are constitutional views showing another embodiment of the manufacturing method of the display device of the present invention;

FIG. 14A to FIG. 14E are constitutional views showing another embodiment of the manufacturing method of the display device of the present invention which follows FIG. 13G;

DESCRIPTION OF THE PREFERRED EMBODIMENTS

Hereinafter, a display device of the present invention and a manufacturing method of the display device are explained in conjunction with drawings.

Embodiment 1

Whole Constitution

Figure 24:
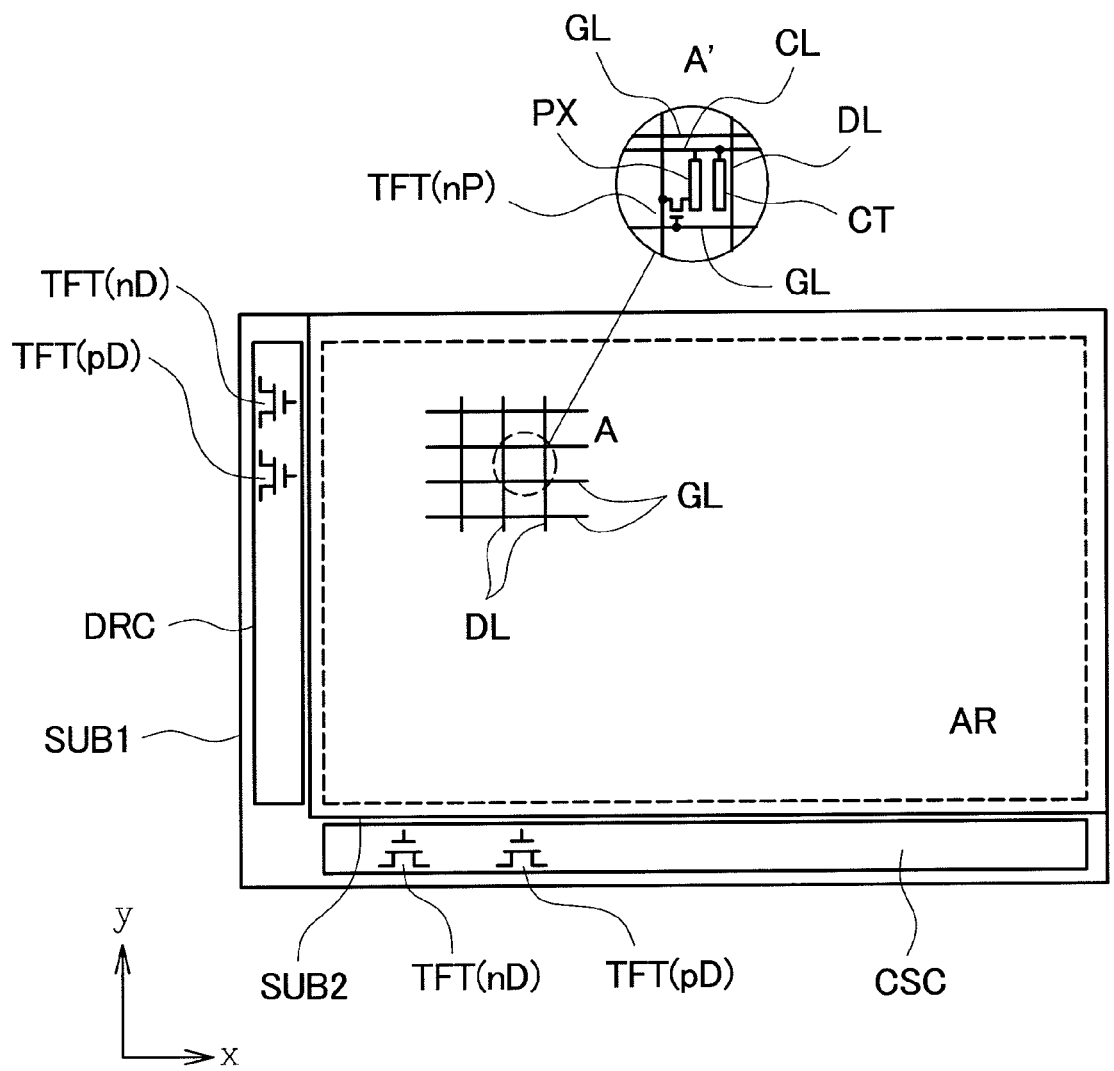
FIG. 24 is a constitutional view showing the schematic constitution of the display device of the present invention.

FIG. 24 is a schematic constitutional view showing one embodiment of the display device of the present invention. In FIG. 24, a liquid crystal display device is shown as an example.

Substrates SUB1, SUB2 are arranged to face each other in an opposed manner with liquid crystal sandwiched therebetween, and a liquid crystal display region AR is formed on a liquid-crystal-side surface of the substrate SUB2, for example.

On liquid-crystal-side surfaces of the substrates SUB1, SUB2 in the liquid crystal display region AR, a plurality of pixels which is arranged in a matrix array is formed.

As shown in an enlarged view A' indicated by a dotted line A in the drawing, each pixel is formed in a region which is surrounded by drain signal lines DL which extend in the x direction and are arranged in parallel to each other in the y direction in the drawing and gate signal lines GL which extend in the y direction and are arranged parallel to each other in the x direction in the drawing.

Further, each pixel includes a thin film transistor TFT which is turned on in response to a scanning signal (voltage) from one gate signal line GL (to identify this thin film transistor TFT from another thin film transistor TFT described later, this thin film transistor is indicated by symbol TFT (nP)), a pixel electrode PX to which a video signal (voltage) from one drain signal line DL is supplied via the turned-on thin film transistor TFT(nP), and a counter electrode CT which generates an electric field between the pixel electrode PX and the counter electrode CT.

Further, the counter electrode CT is connected to a counter voltage signal line CL which is arranged parallel to the gate signal line GL, for example, and a signal (voltage) which is used as a reference with respect to the video signal is supplied to the counter electrode CT via the counter voltage signal line CL.

On a front surface of the substrate SUB1 outside (for example, a left side in the drawing) the liquid crystal display region AR, a drive circuit DRC which is provided for sequentially supplying scanning signals to the gate signal lines GL and for supplying video signals to the drain signal lines DL in accordance with the timing of the supply of the scanning signals is formed. The drive circuit DRC is constituted by including an n-type thin film transistors TFT(nD) and p-type thin film transistors TFT(pD).

Further, on the front surface of the substrate SUB1 outside (for example, a lower side in the drawing) of the liquid crystal display region AR, there is provided an RGB switching circuit CSC which is provided for connecting the drain signal lines DL allocated respectively to three primary colors in a unit pixel of color display in a switching manner for every color. Over the RGB switching circuit CSC, thin film transistors having the constitution substantially equal to the constitution of the thin film transistor TFT(nD) and the constitution of the thin film transistor TFT(pD) in the above-mentioned drive circuit DRC are formed.

(Constitution of Thin Film Transistor)

Figure 1:
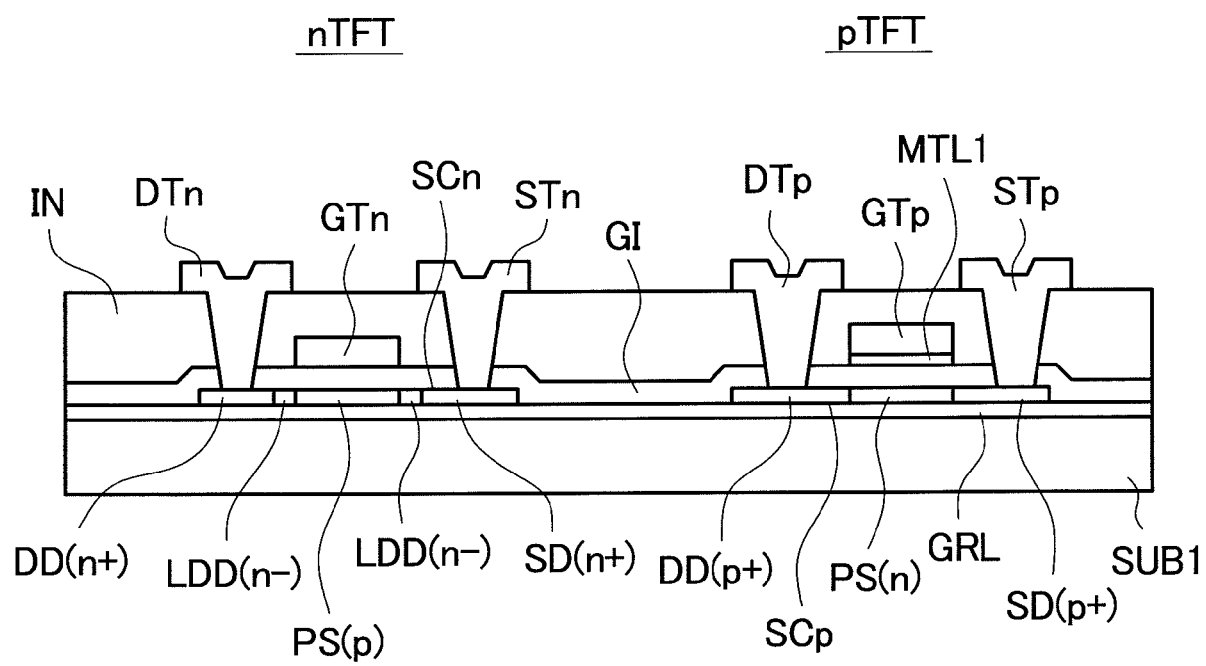
FIG. 1 is a constitutional view showing one embodiment of a display device of the present invention and showing one embodiment of a thin film transistor which is formed over a substrate of the display device.

FIG. 1 is a cross-sectional view showing one embodiment of the thin film transistor which is formed over the substrate of the display device of the present invention.

Here, the thin film transistor explained hereinafter is applicable to all of the above-mentioned respective thin film transistors TFT(nP), TFT(nD), and TFT(pD).

In FIG. 1, a left side shows a region where an n-type thin film transistor (indicated by symbol nTFT in the drawing) having the MIS structure is formed, and a right side shows a p-type thin film transistor (indicated by symbol pTFT in the drawing) having the MIS structure.

In FIG. 1, the substrate SUB1 made of glass, for example, is shown, and a background film GRL made of SiN is formed on a front surface of the substrate SUB1, for example. The background film GRL is configured to prevent impurity in the inside of the substrate SUB1 from entering the semiconductor layer of the thin film transistor.

On an upper surface of the background film GRL, a semiconductor layer SCn is formed in a region where the n-type thin film transistor nTFT is formed, and a semiconductor layer SCp is formed in a region where the p-type thin film transistor pTFT is formed respectively.

Further, on an upper surface of the substrate SUB1, an insulation film GI is formed so as to cover the semiconductor layer SCn and the semiconductor layer SCp. The insulation film GI functions as a gate insulation film in respective regions where the thin film transistor is formed.

On an upper surface of the insulation film GI, a gate electrode GTn is formed in a state that the gate electrode GTn overlaps with a portion of the semiconductor layer SCn, that is, the gate electrode GTn intersects a center portion of the semiconductor layer SCn as viewed in a plan view and, further, a gate electrode GTp is formed in a state that the gate electrode GTp overlaps with a portion of the semiconductor layer SCp, that is, the gate electrode GTp intersects a center portion of the semiconductor layer SCp as viewed in a plan view.

The semiconductor layer SCn has a portion thereof (channel region) which overlaps with the gate electrode GTn formed as a p-type semiconductor layer PS(p). Further, an LDD layer LDD(n−) is formed in narrow regions arranged outside the p-type semiconductor layer PS(p) respectively, and a drain region DD(n+) and a source region SD(n+) are respectively formed in relatively wide regions arranged outside the LDD layers LDD(n−).

Here, in the thin film transistor having the MIS structure, although the drain region and the source region may be changed over depending on a bias applied state, in this specification, for sake of facilitating the explanation of the invention, a region on a left side in the drawing is referred to as a drain region, and a region on a right side in the drawing is referred to as a source region.

The semiconductor layer SCp has a portion thereof (channel region) which overlaps with the gate electrode GTp formed as an n-type semiconductor layer PS(n). Further, a drain region DD(p+) and a source region SD(p+) are respectively formed in regions arranged outside the n-type semiconductor layer PS(n).

On an upper surface of the insulation film GI, an interlayer insulation film IN is formed so as to cover the gate electrodes GTn, GTp.

On an upper surface of the interlayer insulation film IN, a drain electrode DTn which is connected to the drain region DD(n+) through a contact hole formed in the interlayer insulation film IN and a source electrode STn which is connected to the source region SD(n+) through a contact hole formed in the interlayer insulation film IN are formed over a side of the n-type thin film transistor nTFT, and over a side of the p-type thin film transistor pTFT, a drain electrode DTp which is connected to the drain region DD(p+) through a contact hole formed in the interlayer insulation film IN and a source electrode STp which is connected to the source region SD(p+) through a contact hole formed in the interlayer insulation film IN are formed.

The thin film transistor having such constitution has a feature that, for example, a metal layer MTL1 which is made of a material (for example, titanium (Ti)) different from a material of the gate electrode GTp is formed over an insulation film GI side of the gate electrode GTp of the p-type thin film transistor pTFT, for example.

Further, it is not always necessary to form the metal layer MTL1 on the gate electrode GTp side of the p-type thin film transistor pTFT. That is, the metal layer MTL1 may be formed over the gate electrode GTn side of the n-type thin film transistor nTFT.

Further, in the thin film transistor shown in FIG. 1, the LDD layer is formed in the n-type thin film transistor nTFT. However, the LDD layer is not limited to the above-mentioned constitution. That is, the LDD layer may be formed in the p-type thin film transistor pTFT, or may be formed in both of the n-type thin film transistor nTFT and the p-type thin film transistor pTFT.

(Manufacturing Method)

FIG. 2 and FIG. 3 show one embodiment of the manufacturing method of the display device of the present invention, and show manufacturing steps of the thin film transistors formed over the substrate of the display device.

Corresponding to the structure shown in FIG. 1, in FIG. 2 and FIG. 3, a left side of the drawing indicates a region where the n-type thin film transistor having the MIS structure is formed, and a right side of the drawing indicates a region where the p-type thin film transistor having the MIS structure is formed. Hereinafter, the manufacturing method of the thin film transistor is explained in order of steps.

Figure 2A:
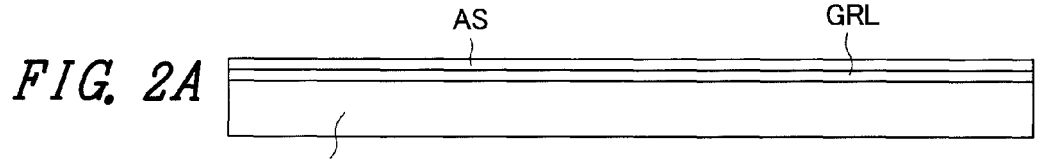
FIG. 2A to FIG. 2G are constitutional views showing one embodiment of a manufacturing method of the display device of the present invention.

Step 1. (FIG. 2A)

The substrate SUB1 is prepared, and the background film GRL made of SiN is formed over the substrate SUB1, for example. Further, an amorphous semiconductor layer AS made of amorphous Si is formed on a surface of the background film GRL.

Figure 2B:
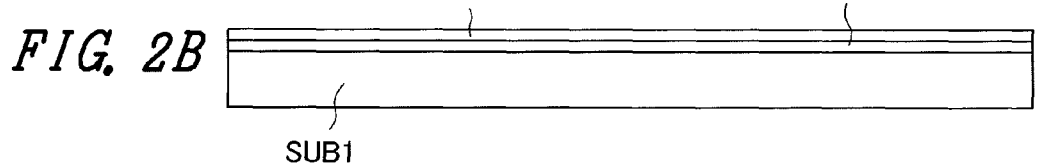

Step 2. (FIG. 2B)

By radiating laser beams generated by an excimer laser to the amorphous semiconductor layer AS, for example, the amorphous semiconductor layer AS is transformed into a poly-crystalline semiconductor layer PS made of polysilicon (poly-Si).

Figure 2C:
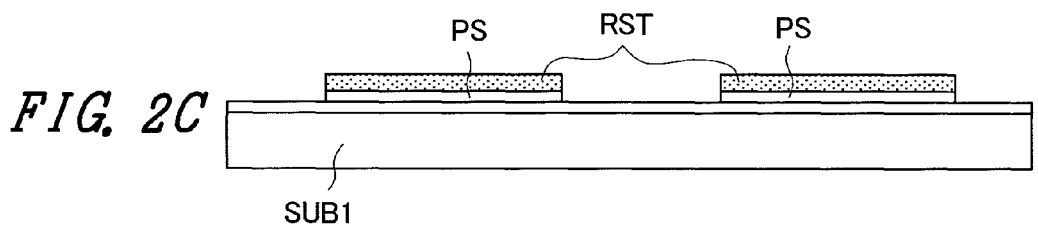

Step 3. (FIG. 2C)

A photoresist film RST is formed on the whole region of an upper surface of the poly-crystalline semiconductor layer PS. Then, the photoresist film RST is allowed to remain in the region of the n-type thin film transistor nTFT where the semiconductor layer is formed and the region of the p-type thin film transistor pTFT where the semiconductor layer is formed respectively using a photolithography technique.

Using the remaining photoresist film RST as a mask, the poly-crystalline semiconductor layer PS is etched to allow the poly-crystalline semiconductor layer PS below the photoresist film RST to remain.

Figure 2D:
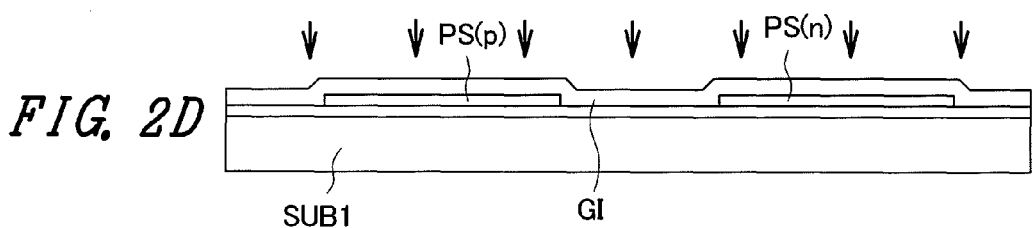

Step 4. (FIG. 2D)

The insulation film GI made of $SiO_2$ is formed on the upper surface of the substrate SUB1 so as to cover the poly-crystalline semiconductor layer PS, for example.

The n-type impurity is injected from above the insulation film GI by ion implantation thus transforming the poly-crystalline semiconductor layer PS into an n-type semiconductor layer PS(n).

Figure 2E:
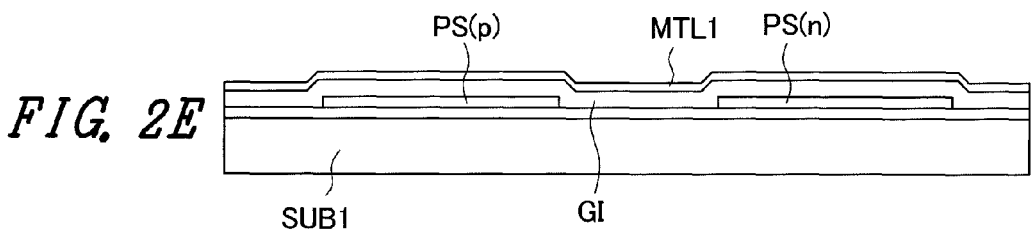

Step 5. (FIG. 2E)

A metal layer MTL1 made of titanium (Ti) and having a film thickness of 30 to 50 nm is formed on an upper surface of the insulation film GI by sputtering, for example.

Figure 2F:
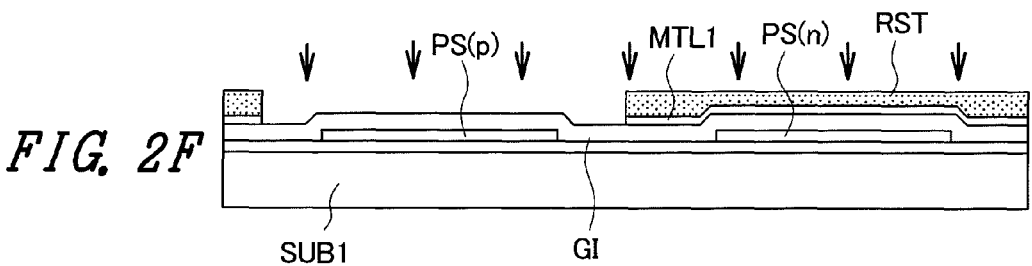

Step 6. (FIG. 2F)

The photoresist film RST is formed on the whole region of an upper surface of the metal layer MTL1, and an opening is formed in a region of the photoresist film RST where the n-type thin film transistor nTFT is formed using a photolithography technique.

Figure 2G:
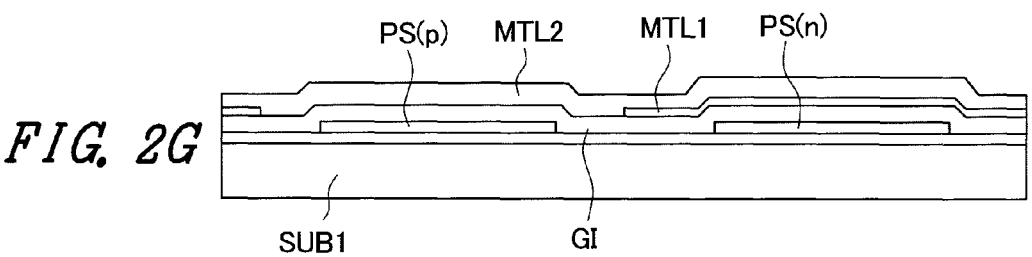

By injecting p-type impurity through the remaining photoresist film RST by ion implantation, the semiconductor layer PS(n) in a region where the n-type thin film transistor nTFT is formed is transformed into a p-type semiconductor layer Step 7. (FIG. 2G)

The photoresist film RST is removed, and a metal layer MLT2 made of MoW, for example, and having a film thickness of approximately 150 nm is formed on the upper surface of the substrate SUB1 by sputtering.

Figure 3A:
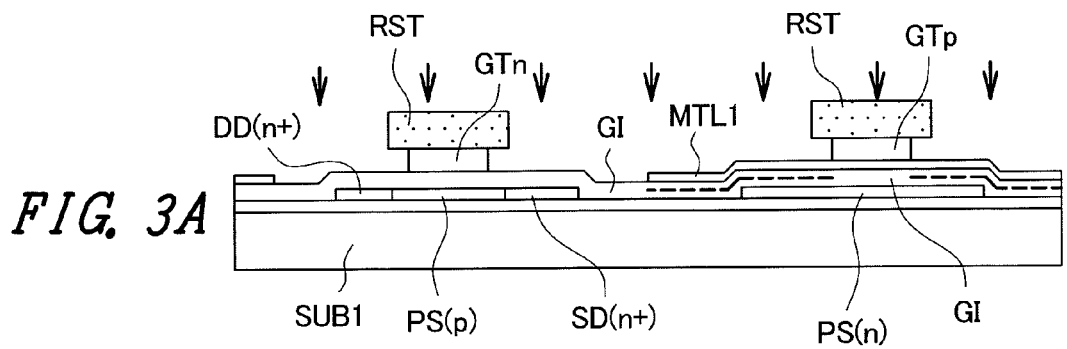
FIG. 3A to FIG. 3E are constitutional views showing the manufacturing method of the display device of the present invention which follows FIG. 2G.

Step 8. (FIG. 3A)

The photoresist film RST is formed on the whole region of an upper surface of the metal layer MTL2, and the photoresist film RST is allowed to remain in a region of the n-type thin film transistor nTFT where the gate electrode is formed and in a region of the p-type thin film transistor pTFT where the gate electrode is formed respectively using a photolithography technique.

Further, using the remaining photoresist film RST as a mask, the metal layer MTL2 is etched by wet etching thus forming the gate electrodes (GTn, GTp).

In this case, the metal layer MTL2 is etched by side etching by an approximately 1 μm, for example, with respect to the mask.

In a state that the photoresist film RST is allowed to remain as it is, the ion implantation of n-type impurity with high concentration is performed.

In this case, the ion implantation is performed such that a peak depth reaches a position in the vicinity of a surface of the semiconductor layer PS(p) of the n-type thin film transistor nTFT. Accordingly, the semiconductor layer PS(p) of the n-type thin film transistor nTFT is doped with the n-type impurity thus forming the drain region DD(n+) and the source region SD(n+). The drain region DD(n+) and the source region SD(n+) are formed in a spaced-apart manner from a region where the gate electrode GT is formed as viewed in a plan view by a distance of approximately 1 μm.

On the other hand, in a region where the p-type thin film transistor pTFT is formed, although the ion implantation of n-type impurity is performed through the metal layer MTL2, the n-type impurity does not reach the semiconductor layer PS(n) and remains in the insulation film GI (indicated by a dotted line in the drawing).

In performing the ion implantation, a film thickness of the metal layer MTL1 made of titanium is treated as a film thickness twice as large as a film thickness of the silicon oxide film (SiO$_2$) in conversion. Accordingly, when the insulation film GI has a film thickness of 100 nm and the metal layer MTL1 having a film thickness of 30 nm is formed on an upper surface of the insulation film GI, an acceleration voltage for ion implantation may be set by setting a film thickness of the metal layer MTL1 to 160 nm in terms of SiO$_2$.

Accordingly, by arranging the metal layer MTL1 on the p-type thin film transistor pTFT side, for example, the ion implantation can be selectively performed without forming the photoresist film using a photolithography technique.

Figure 3B:
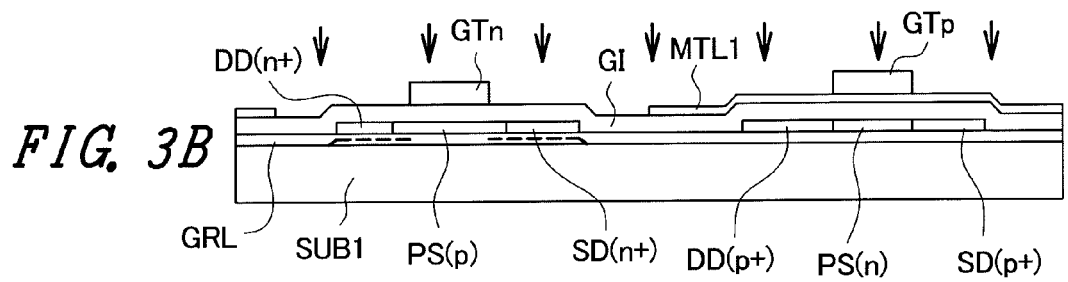

Step 9. (FIG. 3B)

The photoresist film RST is removed, and the ion implantation of p-type impurity with high concentration is performed. In this case, the ion implantation is performed such that a peak depth reaches a position in the vicinity of a surface of the semiconductor layer PS(n) of the p-type thin film transistor pTFT.

Accordingly, the semiconductor layer PS(n) of the p-type thin film transistor pTFT is doped with the p-type impurity thus forming the drain region DD(p+) and the source region SD(p+) The drain region DD(p+) and the source region SD(p+) are formed at positions adjacent to a region where the gate electrode GTp is formed as viewed in a plan view.

Here, in the region where the n-type thin film transistor nTFT is formed, p-type impurity is injected into a region where the metal layer MTL1 is not formed by ion implantation and hence, the p-type impurity passes through the semiconductor layer PS(p), the drain region DD(n+) and the source region SD(n+) and remains in the background film GRL (indicated by a dotted line in the drawing).

Figure 3C:
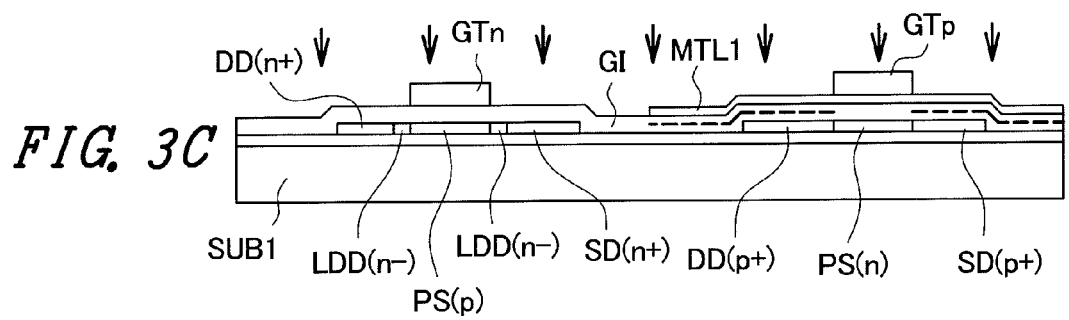

Step 10. (FIG. 3C)

Next, the ion implantation of n-type impurity with low concentration is performed. In this case, the ion implantation is performed such that a peak depth reaches a position in the vicinity of a surface of the semiconductor layer PS(p) of the n-type thin film transistor nTFT or the like.

Accordingly, the semiconductor layer PS(p) of the n-type thin film transistor nTFT is doped with the n-type impurity thus forming the LDD region LDD(n−).

The LDD regions LDD(n−) are arranged adjacent to the region where the gate electrode GTn is formed as viewed in a plan view, and are formed inside the drain region DD(n+) and the source region SD(n+).

Here, in the region where the p-type thin film transistor pTFT is formed, although the ion implantation of n-type impurity is performed through the metal layer MTL1, the n-type impurity does not reach the semiconductor layer PS(n) and remains in the insulation film GI (indicated by a dotted line in the drawing).

Figure 3D:
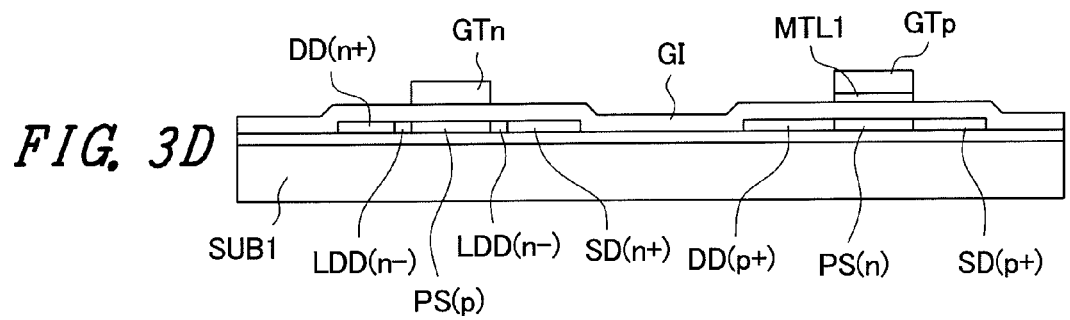

Step 11. (FIG. 3D)

Using the gate electrodes (GTn, GTp) as masks, the metal layer MTL1 is etched.

Figure 3E:
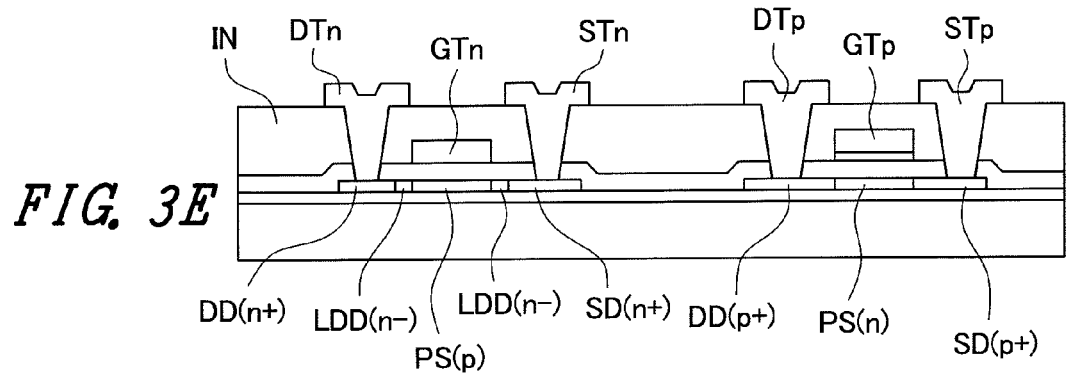

Step 12. (FIG. 3E)

The interlayer insulation film IN is formed on an upper surface of the substrate SUB1. The contact holes which expose a portion of the drain region DD(n+) and a portion of the source region SD(n+) of the n-type thin film transistor nTFT and the contact holes which expose a portion of the drain region DD(p+) and a portion of the source region SD(p+) of the p-type thin film transistor pTFT are formed in the interlayer insulation film IN.

Further, a metal film is formed on the whole region of the interlayer insulation film IN so as to cover the respective contact holes, and the metal film is etched by selective etching using a photolithography technique thus forming the drain electrode DTn connected with the drain region DD(n+) and the source electrode STn connected with the source region SD(n+) in the n-type thin film transistor nTFT and forming the drain electrode DTp connected with the drain region DD(p+) and the source electrode STp connected with the source region SD(p+) in the p-type thin film transistor pTFT.

Embodiment 2

FIG. 4 to FIG. 6 are step views showing manufacturing steps of another embodiment of the liquid crystal display device of the present invention, and these views correspond to above-mentioned FIG. 2 and FIG. 3. Both of the n-type thin film transistor nTFT and the p-type thin film transistor pTFT shown in FIG. 4 to FIG. 6 are configured to respectively include an LDD layer.

Steps shown in FIG. 4A to FIG. 4G are substantially equal to the steps shown in FIG. 2A to FIG. 2G. Accordingly, only steps shown in FIG. 5A and drawings which follow FIG. 5A are sequentially explained hereinafter.

Step 1. (FIG. 5A)

Using the photoresist film RST as a mask, the metal layer MTL2 is etched by wet etching thus forming the gate electrodes (GTn, GTp). In this case, the metal layer MTL2 is etched by side etching by an approximately 1 μm with respect to the mask.

The photoresist film RST is allowed to remain as it is and, thereafter, the ion implantation of p-type impurity with high concentration is performed. In this case, the ion implantation is performed such that a peak depth reaches a position in the vicinity of an upper surface of the semiconductor layer PS(n) of the p-type thin film transistor pTFT. Accordingly, the semiconductor layer PS(p) of the p-type thin film transistor pTFT is doped with p-type impurity thus forming a drain region DD(p+) and a source region SD(p+). The drain region DD(p+) and the source region SD(p+) are formed in a spaced-apart manner by a distance of approximately 1 μm from a region where the gate electrode GTp is formed as viewed in a plan view.

Here, in a region where the n-type thin film transistor nTFT is formed, the p-type impurity passes through the semiconductor layer PS(p) of the n-type thin film transistor nTFT and remains in the background film GRL (indicated by a dotted line in the drawing).

Figure 5A:
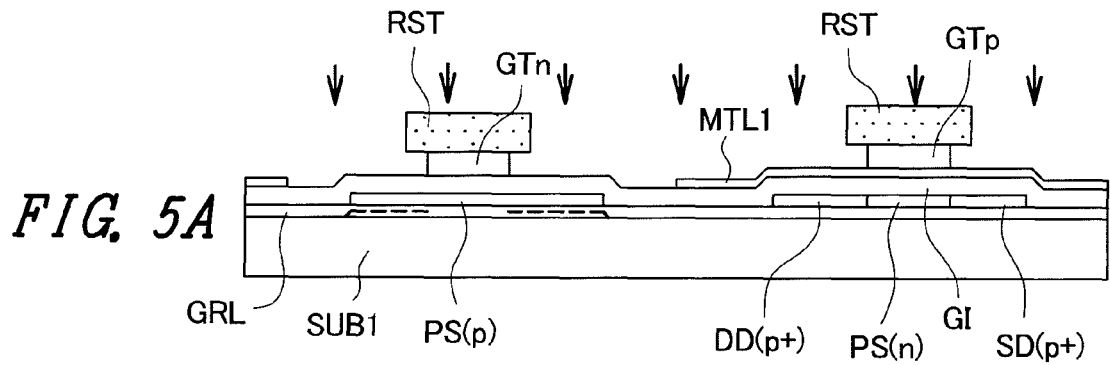
FIG. 5A to FIG. 5D are constitutional views showing another embodiment of the manufacturing method of the display device of the present invention which follows FIG. 4G.
Figure 5B:
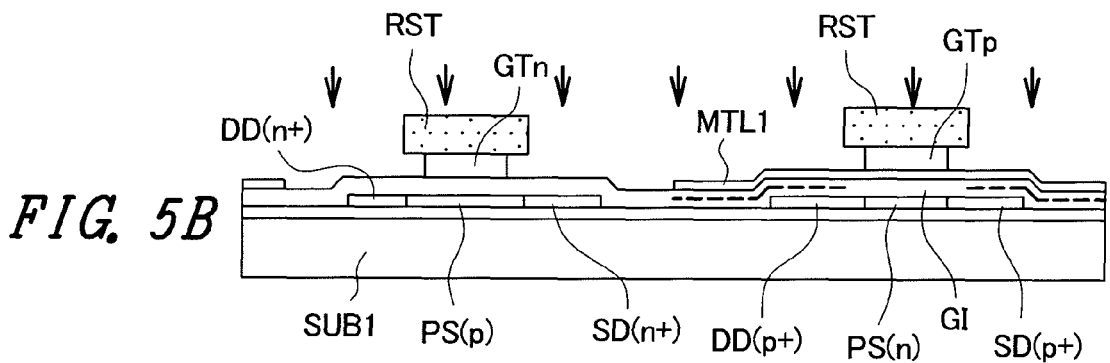

Step 2. (FIG. 5B)

In a state that the photoresist film RST is allowed to remain as it is, the ion implantation of n-type impurity with high concentration is performed. In this case, the ion implantation is performed such that a peak depth reaches a position in the vicinity of an upper surface of the semiconductor layer PS(p) of the n-type thin film transistor nTFT.

Accordingly, the semiconductor layer PS(p) of the n-type thin film transistor nTFT is doped with the n-type impurity thus forming the drain region DD(n+) and the source region SD(n+). The drain region DD(n+) and the source region SD(n+) are formed in a spaced-apart manner from a region where the gate electrode GTn is formed as viewed in a plan view by a distance of approximately 1 μm.

Figure 5C:
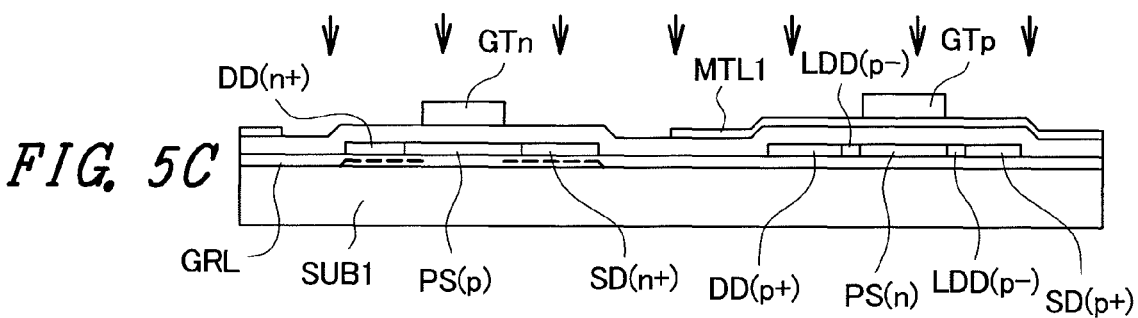

Here, in a region where the p-type thin film transistor pTFT is formed, the n-type impurity remains in the insulation film GI (indicated by a dotted line in the drawing).
Step 3. (FIG. 5C)

The photoresist film RST is removed, and the ion implantation of p-type impurity with low concentration is performed. In this case, the ion implantation is performed such that a peak depth reaches a position in the vicinity of an upper surface of the semiconductor layer PS(n) of the p-type thin film transistor pTFT.

Accordingly, the semiconductor layer PS(n) of the p-type thin film transistor pTFT is doped with the p-type impurity thus forming an LDD layer LDD(p−) on a channel region side arranged adjacent to the drain region DD(p+) and an LDD layer LDD(p−) on a channel region side arranged adjacent to the source region SD(p+) respectively.

Figure 5D:
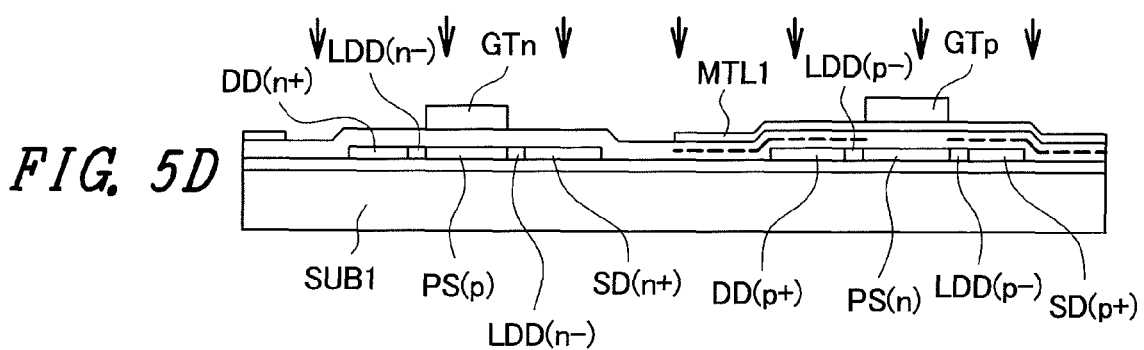

Here, in the region where the n-type thin film transistor nTFT is formed, the p-type impurity remains in a background film GRL (indicated by a dotted line in the drawing).
Step 4. (FIG. 5D)

The ion implantation of n-type impurity with low concentration is performed. In this case, the ion implantation is performed such that a peak depth reaches a position in the vicinity of an upper surface of the semiconductor layer PS(p) of the n-type thin film transistor nTFT.

Accordingly, the semiconductor layer PS(p) of the n-type thin film transistor nTFT is doped with the n-type impurity thus forming an LDD layer LDD(n−) on a channel region side arranged adjacent to the drain region DD(n+) and an LDD layer LDD(n−) on a channel region side arranged adjacent to the source region SD(n+) respectively.

Here, in the region where the p-type thin film transistor nTFT is formed, the n-type impurity remains in the insulation film GI (indicated by a dotted line in the drawing).

Figure 6A:
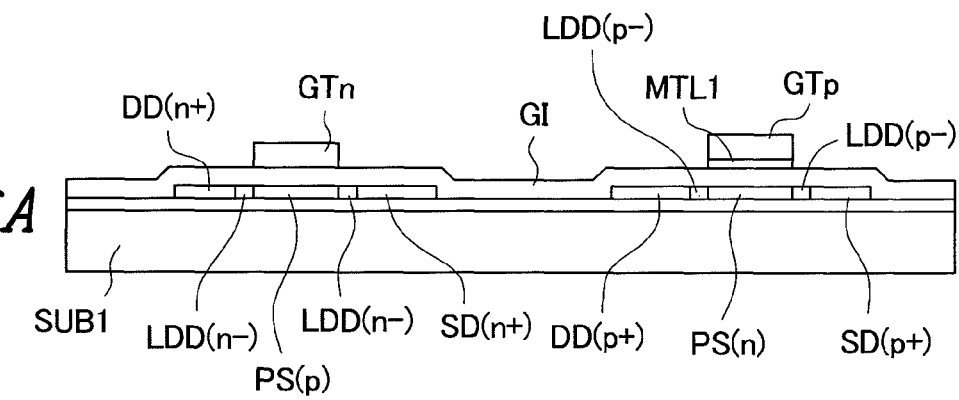
FIG. 6A and FIG. 6B are constitutional views showing another embodiment of the manufacturing method of the display device of the present invention which follows FIG. 5D.
Figure 6B:
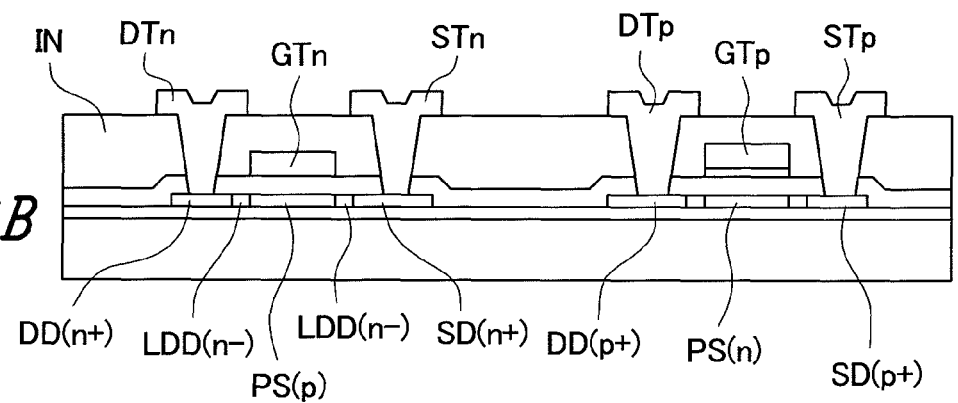

Thereafter, the manufacturing process undergoes steps substantially equal to the steps shown in FIG. 3D and FIG. 3E. That is, as shown in FIG. 6A, the metal layer MTL1 is etched using the gate electrode GTp as a mask thus forming, as shown in FIG. 6B, an interlayer insulation film IN, drain electrodes DTn, DTp and source electrodes STn, STp.

Embodiment 3

Figure 9A:
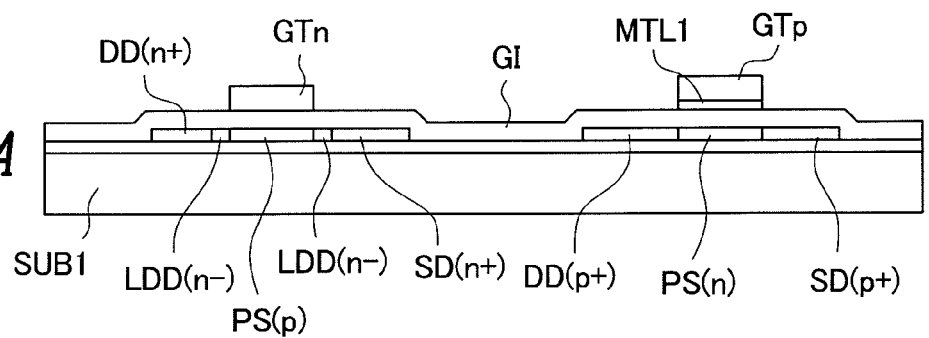
FIG. 9A and FIG. 9B are constitutional views showing another embodiment of the manufacturing method of the display device of the present invention which follows FIG. 8D.
Figure 9B:
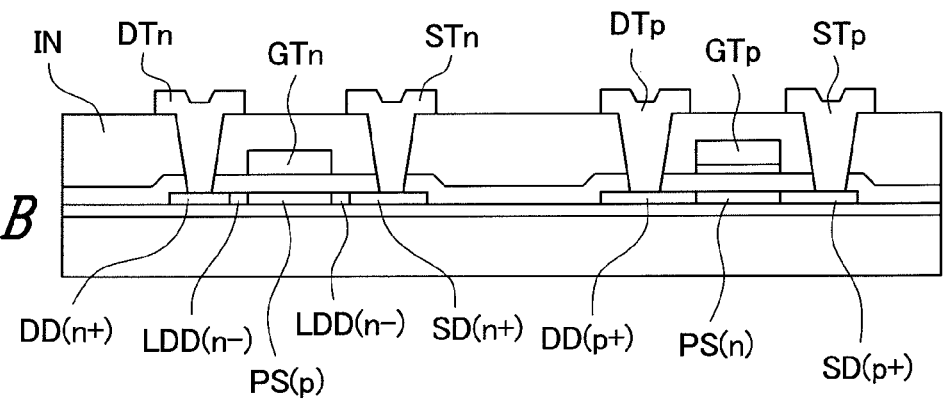
Figure 10A:
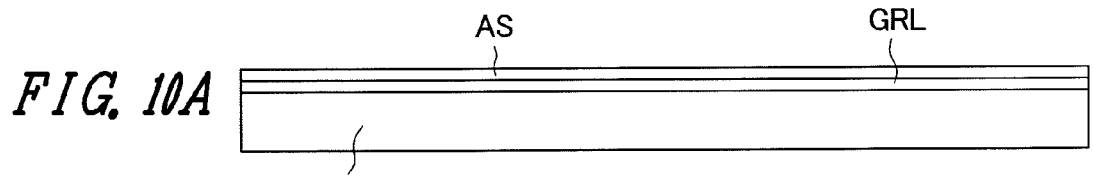
FIG. 10A to FIG. 10F are constitutional views showing another embodiment of the manufacturing method of the display device of the present invention.
Figure 10B:
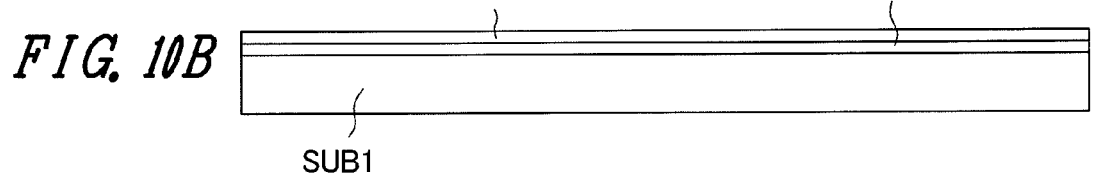
Figure 10C:
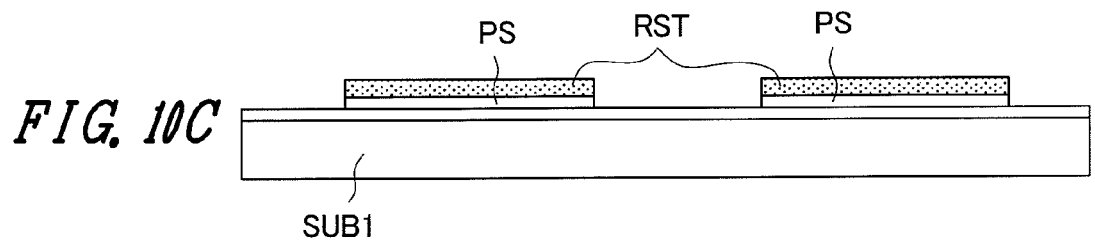
Figure 10D:
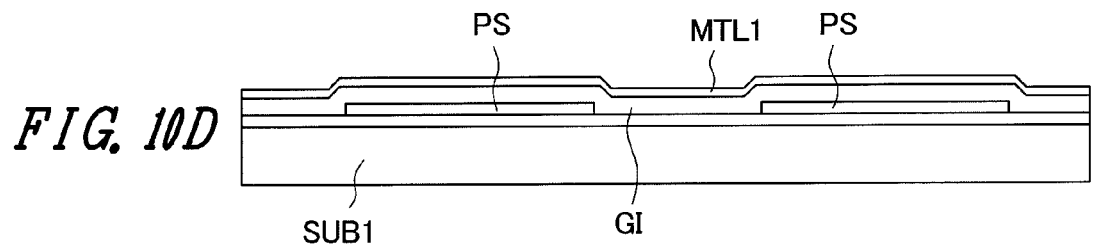
Figure 10E:
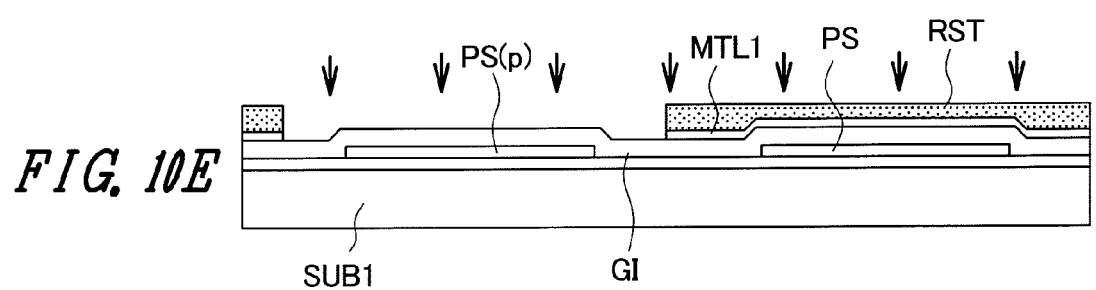
Figure 10F:
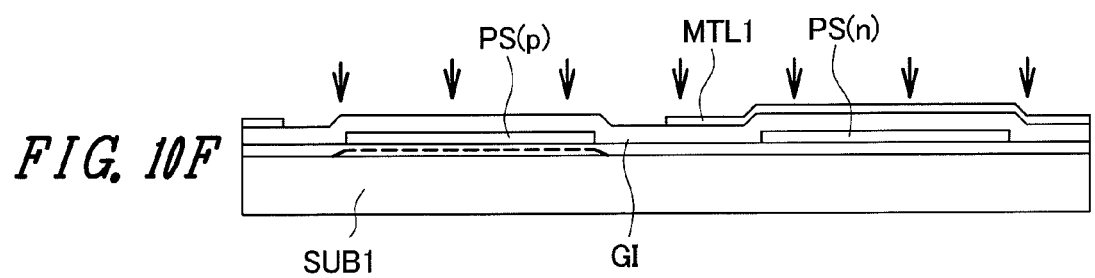

FIG. 7 to FIG. 9 are views showing another embodiment of the manufacturing method of the display device according to the present invention, and these drawings correspond to the above-mentioned FIG. 2 and FIG. 3. The embodiment 3 is a modification of the manufacturing method explained in conjunction with the above-mentioned embodiment 1.

The manufacturing method shown in FIG. 7 to FIG. 9 differs from the manufacturing method shown in FIG. 2 and FIG. 3 due to steps shown in FIG. 7A to FIG. 7E.

That is, the embodiment 3 differs from the embodiment 1 with respect to the steps for forming following parts on the substrate. That is, a p-type semiconductor layer is formed in a region where an n-type thin film transistor is formed, an n-type semiconductor layer is formed in a region where a p-type thin film transistor is formed, an insulation film is formed so as to cover the p-type semiconductor layer and the n-type semiconductor layer, and a metal layer having an opening in a region where the n-type thin film transistor is formed is formed on an upper surface of the insulation film.

Figure 7A:
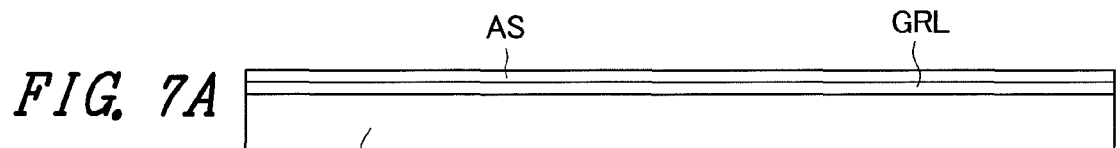
FIG. 7A to FIG. 7F are constitutional views showing another embodiment of the manufacturing method of the display device of the present invention.

Accordingly, in the explanation of this embodiment, steps shown FIG. 7A to FIG. 7F are explained.
Step 1. (FIG. 7A)

A substrate SUB1 is prepared, and a background film GRL made of SiN is formed over the substrate SUB1, for example.

Figure 7B:
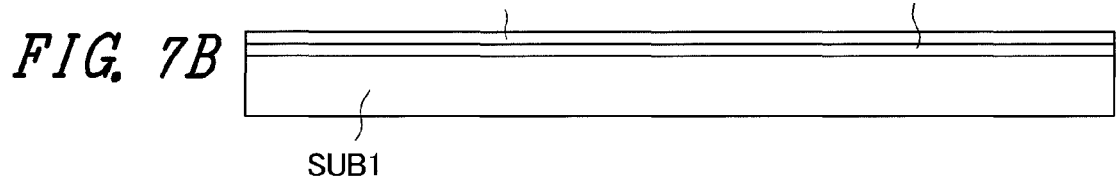

Further, an amorphous semiconductor layer AS made of amorphous Si is formed on a surface of the background film GRL.
Step 2. (FIG. 7B)

Figure 7C:
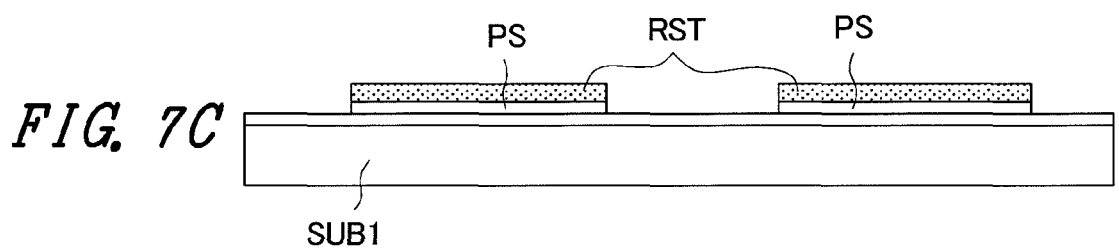

By radiating laser beams generated by an excimer laser to the amorphous semiconductor layer AS, for example, the amorphous semiconductor layer AS is transformed into a poly-crystalline semiconductor layer PS made of poly-Si.
Step 3. (FIG. 7C)

A photoresist film RST is formed on the whole region of an upper surface of the poly-crystalline semiconductor layer PS. Then, the photoresist film RST is allowed to remain in a region where the semiconductor layer of the n-type thin film transistor nTFT is formed and a region where the semiconductor layer of the p-type thin film transistor pTFT is formed respectively using a photolithography technique.

Figure 7D:
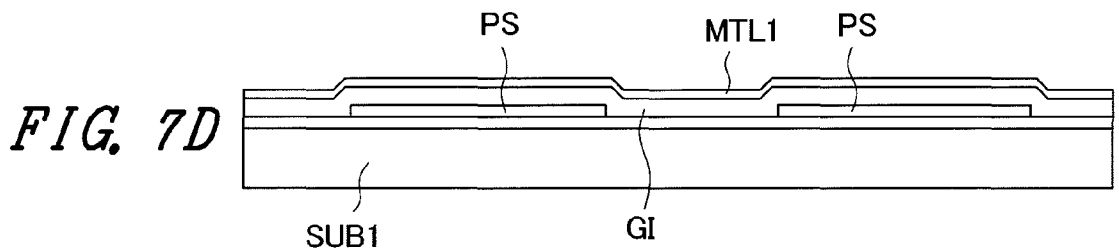

Using the remaining photoresist film RST as a mask, the poly-crystalline semiconductor layer PS is etched to allow the poly-crystalline semiconductor layer PS below the photoresist film RST to remain.
Step 4. (FIG. 7D)

The photoresist film RST is removed, and an insulation film GI made of $SiO_2$ is formed on the upper surface of the substrate SUB1 so as to cover the poly-crystalline semiconductor layer PS, for example.

Figure 7E:
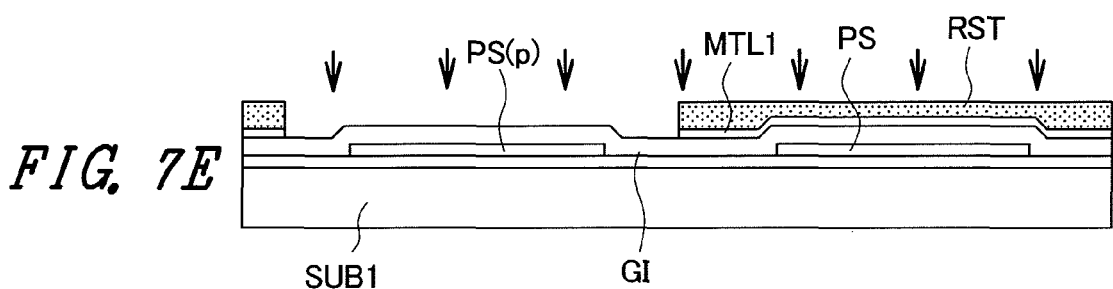

A metal layer MTL1 made of Ti and having a film thickness of 30 to 50 nm is formed over the whole region of a surface of the insulation film GI, for example.
Step 5. (FIG. 7E)

The photoresist film RST is formed on the whole region of a surface of the metal layer MTL1, and the photoresist film RST in a region where the n-type thin film transistor nTFT is formed is removed using a photolithography technique.

Using the remaining photoresist film RST as a mask, the metal layer MTL1 is etched.

Figure 7F:
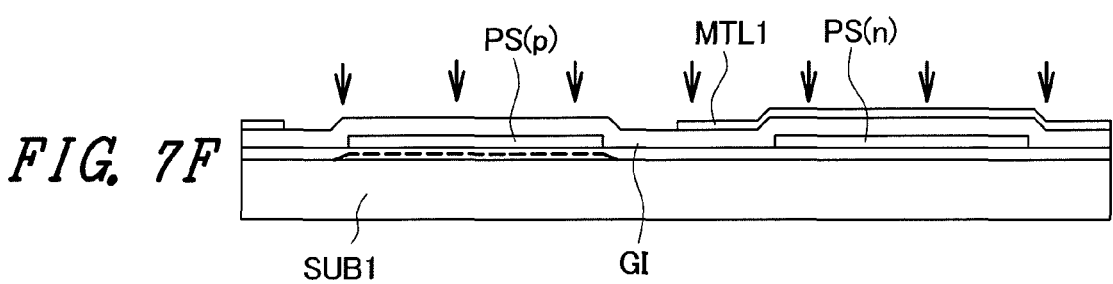
Figure 8A:
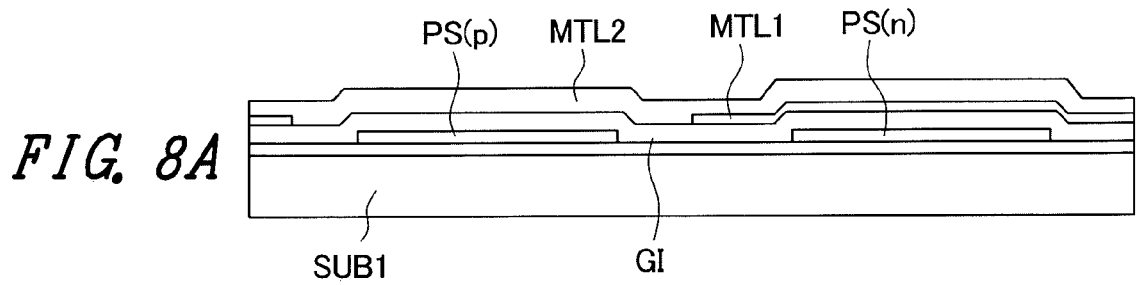
FIG. 8A to FIG. 8D are constitutional views showing another embodiment of the manufacturing method of the display device of the present invention which follows FIG. 7F.
Figure 8B:
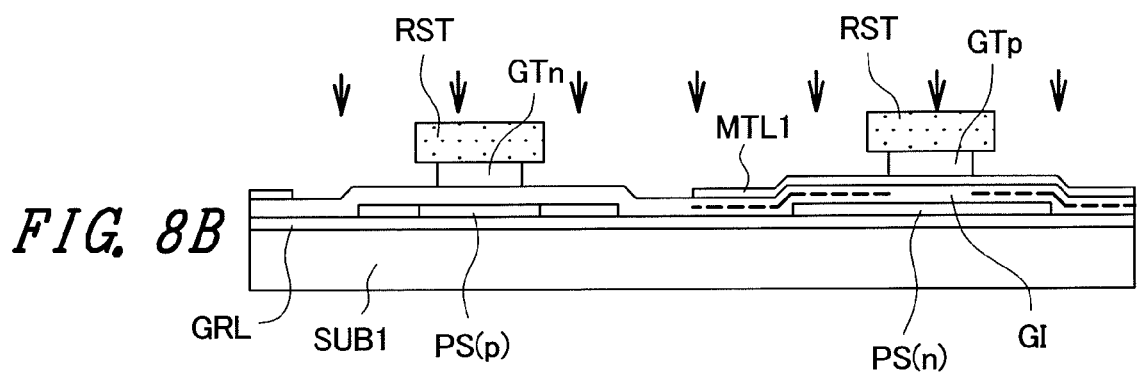
Figure 8C:
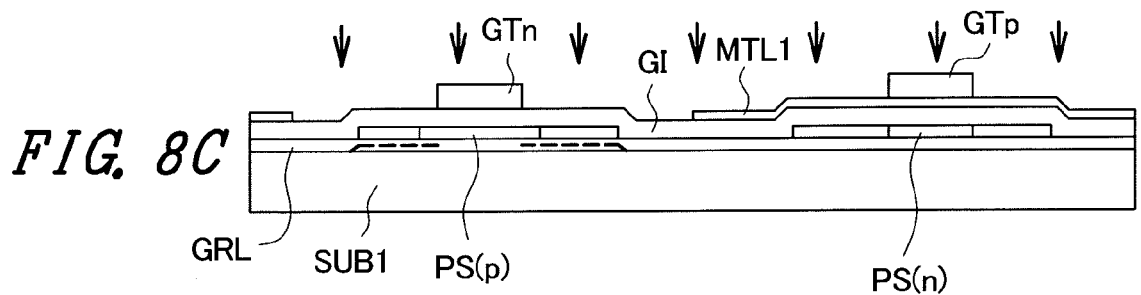
Figure 8D:
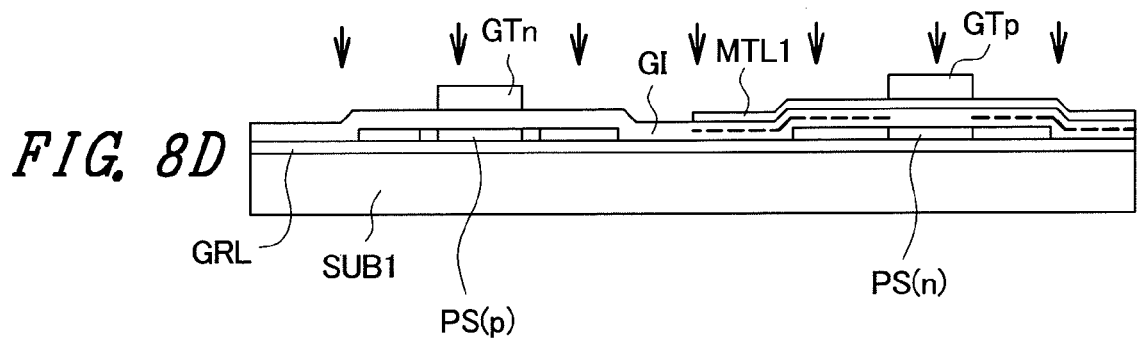

In a state that the photoresist film RST is allowed to remain as it is, the ion implantation of p-type impurity is performed thus forming the semiconductor layer PS into a semiconductor layer PS(p) which is doped with the p-type impurity.
Step 6. (FIG. 7F)

The photoresist film RST is removed, and the ion implantation of n-type impurity with low concentration is performed. In this case, the ion implantation is performed such that a peak depth reaches an upper surface of the semiconductor layer PS of the p-type thin film transistor pTFT. Accordingly, the semiconductor layer PS is formed into a semiconductor layer PS(n) which is doped with the n-type impurity. Here, in the region where the n-type thin film transistor nTFT is formed, the n-type impurity remains in a background film GRL (indicated by a dotted line in the drawing). Steps which come after step 6 shown in FIG. 7F are substantially equal to the above-mentioned steps shown in FIG. 2G and drawings which follow FIG. 2G.

Embodiment 4

Figure 11A:
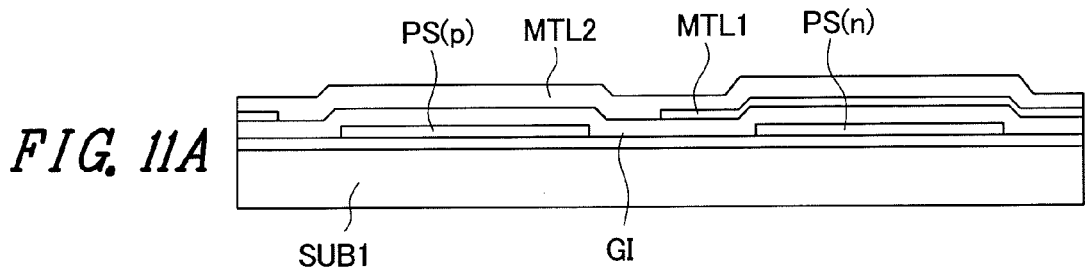
FIG. 11A to FIG. 11E are constitutional views showing another embodiment of the manufacturing method of the display device of the present invention which follows FIG. 10F.
Figure 11B:
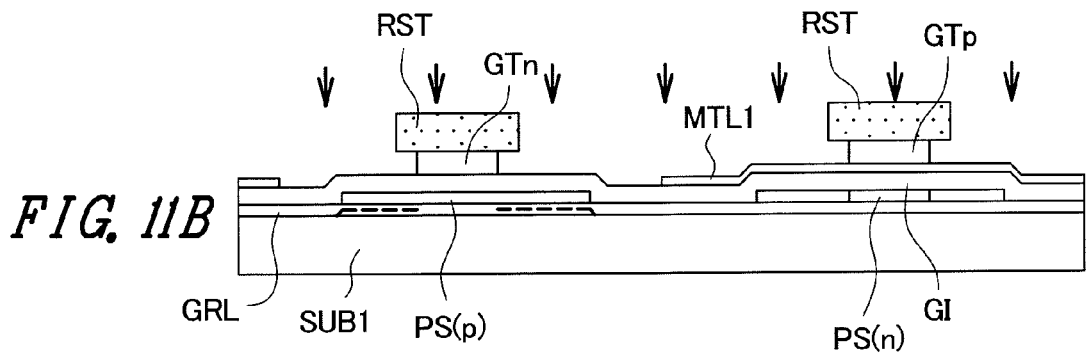
Figure 11C:
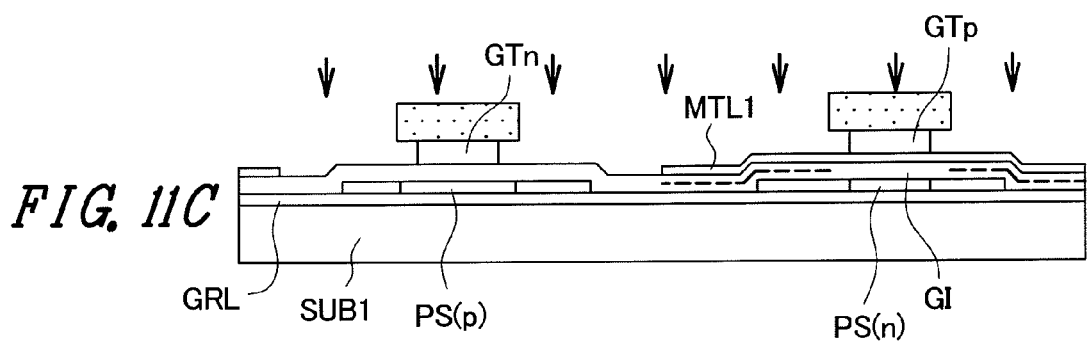
Figure 11D:
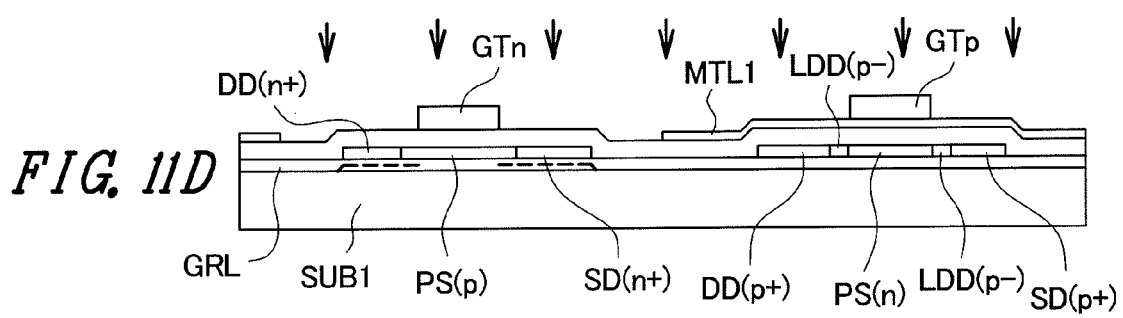
Figure 11E:
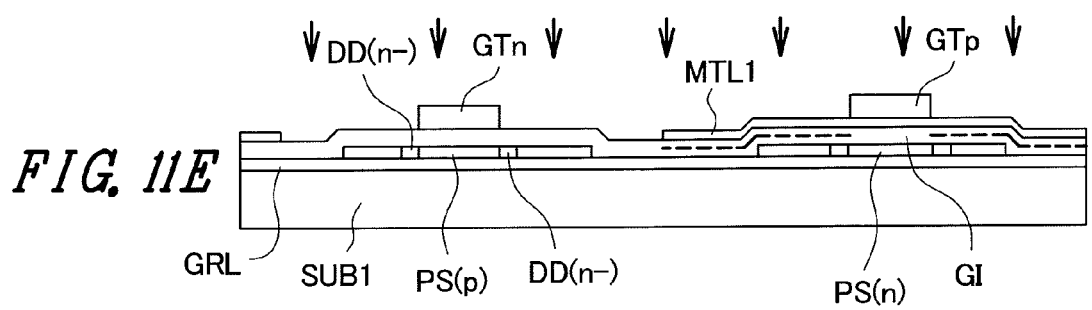
Figure 12A:
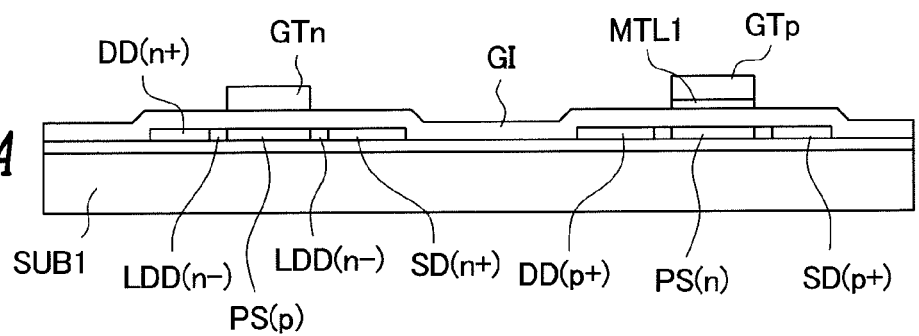
FIG. 12A and FIG. 12B are constitutional views showing another embodiment of the manufacturing method of the display device of the present invention which follows FIG. 11E.
Figure 12B:
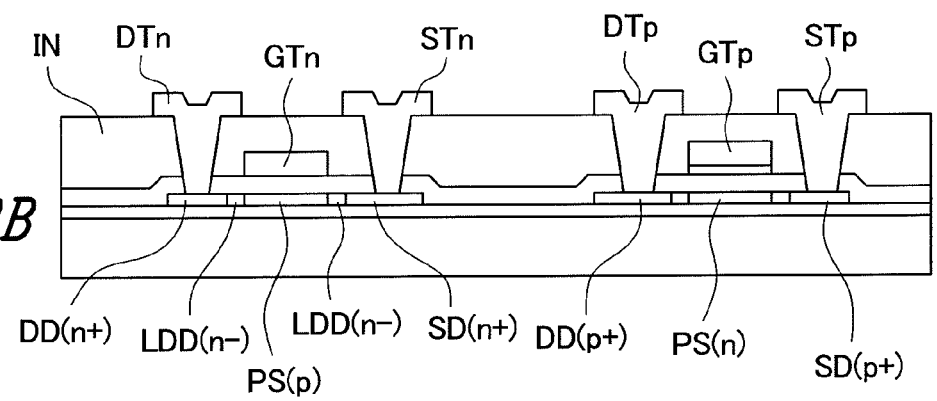

FIG. 10 to FIG. 12 are views showing another embodiment of the manufacturing method of the display device according to the present invention, and these drawings correspond to the above-mentioned FIG. 7 to FIG. 9. The embodiment 4 is a modification of the manufacturing method explained in the above-mentioned embodiment 2.

FIG. 10A to FIG. 10F are substantially equal to FIG. 7A to FIG. 7F.

Figure 4A:
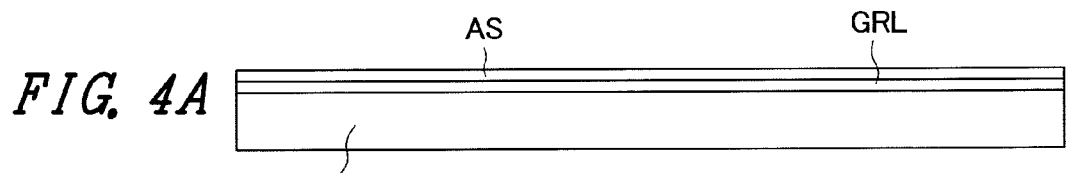
FIG. 4A to FIG. 4G are constitutional views showing another embodiment of the manufacturing method of the display device of the present invention.
Figure 4B:
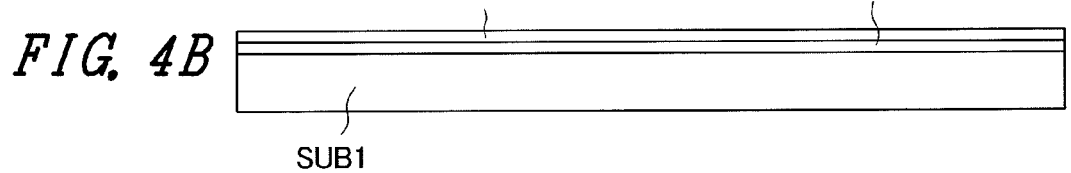
Figure 4C:
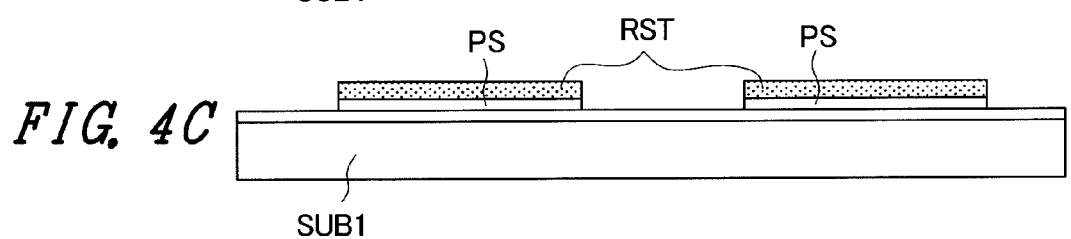
Figure 4D:
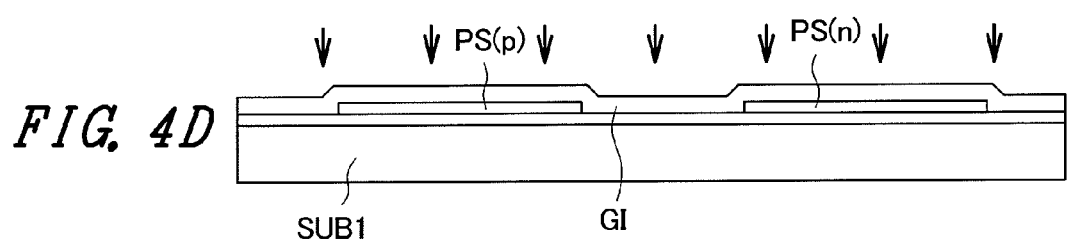
Figure 4E:
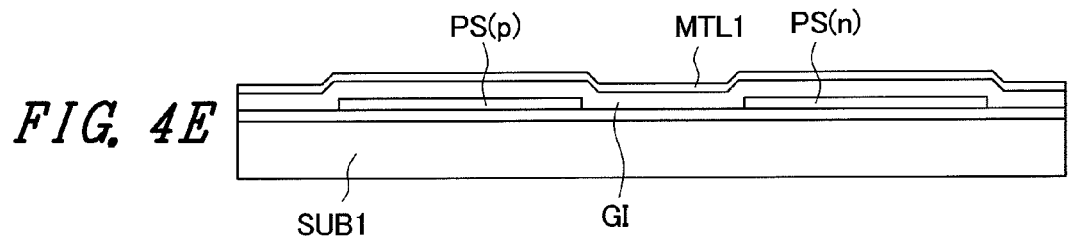
Figure 4F:
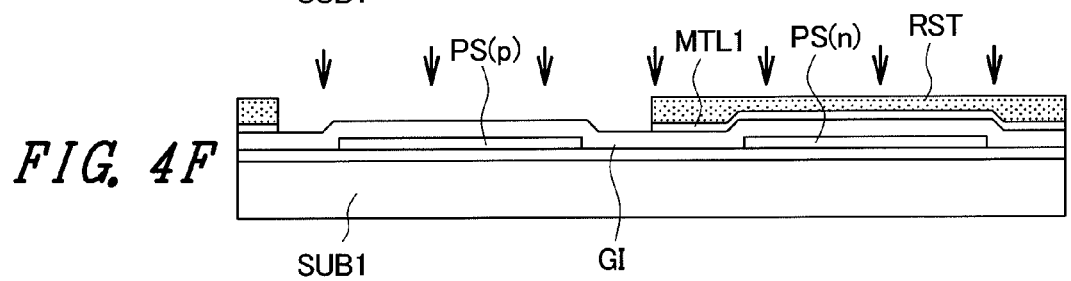
Figure 4G:
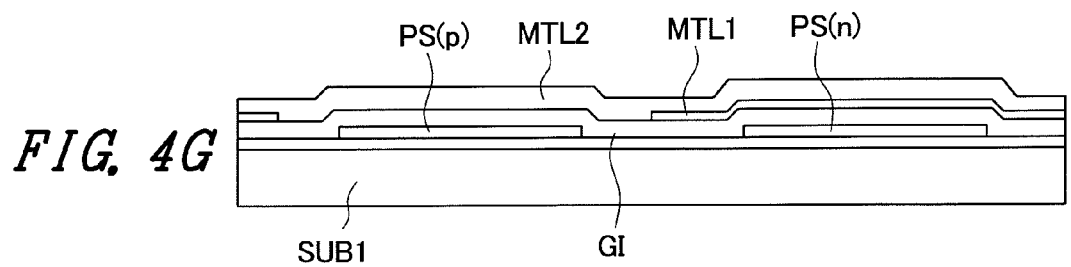

Further, steps which come after the step shown in FIG. 11A are substantially equal to the above-mentioned steps shown in FIG. 4G and the drawings which follow FIG. 4G.

The embodiment 4 can also acquire the substantially same advantageous effect as the above-mentioned embodiments.

Embodiment 5

FIG. 13 and FIG. 14 are views showing another embodiment of the manufacturing method of the display device according to the present invention.

FIG. 13 and FIG. 14 show steps corresponding to the steps shown in the above-mentioned FIG. 2 and FIG. 3. In FIG. 13 and FIG. 14, however, the order of steps in forming the n-type thin film transistor nTFT and the p-type thin film transistor pTFT is opposite to the corresponding order of steps in FIG. 2 and FIG. 3.

Step 1. (FIG. 13A)

The substrate SUB1 is prepared, and a background film GRL made of SiN is formed over a substrate SUB1, for example. Further, an amorphous semiconductor layer AS made of amorphous Si is formed on a surface of the background film GRL.

Step 2. (FIG. 13B)

By radiating laser beams generated by an excimer laser to the amorphous semiconductor layer AS, for example, the amorphous semiconductor layer AS is transformed into a poly-crystalline semiconductor layer PS made of poly-Si.

Step 3. (FIG. 13C)

A photoresist film RST is formed on the whole region of an upper surface of the poly-crystalline semiconductor layer PS. Then, the photoresist film RST is allowed to remain in a region where the semiconductor layer of the n-type thin film transistor nTFT is formed and a region where the semiconductor layer of the p-type thin film transistor pTFT is formed respectively using a photolithography technique.

Using the remaining photoresist film RST as a mask, the poly-crystalline semiconductor layer PS is etched to allow the poly-crystalline semiconductor layer PS below the photoresist film RST to remain.

Step 4. (FIG. 13D)

The insulation film GI made of $SiO_2$ is formed on an upper surface of the substrate SUB1 so as to cover the poly-crystalline semiconductor layer PS, for example.

The p-type impurity is injected from above the insulation film GI by ion implantation thus forming the poly-crystalline semiconductor layer PS into a p-type semiconductor layer PS(p).

Step 5. (FIG. 13E)

A metal layer MTL1 made of titanium (Ti) and having a film thickness of 30 to 50 nm is formed on an upper surface of the insulation film GI by sputtering, for example.

Step 6. (FIG. 13F)

A photoresist film RST is formed on the whole region of an upper surface of the metal layer MTL1, and an opening is formed in a region of the photoresist film RST where the p-type thin film transistor pTFT is formed using a photolithography technique.

By performing ion implantation of the n-type impurity in a state that the photoresist film RST is allowed to remain as it is, the semiconductor layer PS(p) in a region where the p-type thin film transistor pTFT is formed is formed into an n-type semiconductor layer PS(n).

Step 7. (FIG. 13G)

The photoresist film RST is removed, and a metal layer MLT2 made of MoW, for example, and having a film thickness of approximately 150 nm is formed on the upper surface of the substrate SUB1 by sputtering, for example.

Step 8. (FIG. 14A)

A photoresist film RST is formed on the whole region of an upper surface of the metal layer MTL2, and the photoresist film RST is allowed to remain in a region of the n-type thin film transistor nTFT where the gate electrode is formed and in a region of the p-type thin film transistor pTFT where the gate electrode is formed respectively using a photolithography technique.

Further, using the remaining photoresist film RST as a mask, the metal layer MTL2 is etched by wet etching thus forming gate electrodes GTn, GTp.

In this case, the metal layer MTL2 is etched by an approximately 1 μm with respect to the mask by side etching.

In a state that the photoresist film RST is allowed to remain as it is, the ion implantation of n-type impurity with high concentration is performed. Accordingly, the semiconductor layer PS(p) of the n-type thin film transistor nTFT is doped with n-type impurity thus forming a drain region DD(n+) and a source region SD(n+). The drain region DD(n+) and the source region SD(n+) are formed in a spaced-apart manner from a region where the gate electrode GTn is formed as viewed in a plan view by a distance of approximately 1 μm.

Here, in the region where the p-type thin film transistor pTFT is formed, the n-type impurity is injected into a region where the metal layer MTL1 is not formed by ion implantation and hence, the n-type impurity passes through the semiconductor layer PS(n) and remains in a background film GRL (indicated by a dotted line in the drawing).

Step 9. (FIG. 14B)

The photoresist film RST is removed, and the ion implantation of n-type impurity with low concentration is performed. In this case, the ion implantation is performed such that a peak depth reaches a position in the vicinity of a surface of the semiconductor layer PS(p) of the n-type thin film transistor nTFT.

Accordingly, the semiconductor layer PS(p) of the n-type thin film transistor nTFT is doped with the n-type impurity thus forming an LDD region LDD(n−). The LDD regions LDD(n−) are arranged adjacent to region where the gate electrode GTn is formed and are formed inside the drain region DD(n+) and the source region SD(n+) as viewed in a plan view.

Here, in the region where the p-type thin film transistor pTFT is formed, the n-type impurity remains in the background film GRL (indicated by a dotted line in the drawing).

Step 10. (FIG. 14C)

The ion implantation of p-type impurity with high concentration is performed. In this case, the ion implantation is performed such that a peak depth reaches a position in the vicinity of a surface of the semiconductor layer PS(n) of the p-type thin film transistor pTFT.

Accordingly, the semiconductor layer PS(n) of the p-type thin film transistor pTFT is doped with the p-type impurity thus forming the drain region DD(p+) and the source region SD(p+).

The drain region DD(p+) and the source region SD(p+) are formed adjacent to a region where the gate electrode GTp is formed as viewed in a plan view.

Here, in the region where the n-type thin film transistor nTFT is formed, the p-type impurity passes through the metal layer MTL1 by ion implantation and remains in the insulation GI (indicated by a dotted line in the drawing).

Step 11. (FIG. 14D)

Using the gate electrode GTn as a mask, the metal layer MTL1 is etched.

Step 12. (FIG. 14E)

An interlayer insulation film IN is formed on the upper surface of the substrate SUB1. Contact holes which expose a portion of the drain region DD(n+) and a portion of the source region SD(n+) of the n-type thin film transistor nTFT and contact holes which expose a portion of the drain region DD(p+) and a portion of the source region SD(p+) of the p-type thin film transistor pTFT are formed in the interlayer insulation film IN.

Further, a metal film is formed on the whole region of the interlayer insulation film IN so as to cover the respective contact holes, and the metal film is etched by selective etching using a photolithography technique thus forming a drain electrode DTn connected with the drain region DD(n+) and a source electrode STn connected with the source region SD(n+) in the n-type thin film transistor nTFT and forming a drain electrode DTp connected with the drain region DD(p+) and a source electrode STp connected with the source region SD(p+) in the p-type thin film transistor pTFT.

Embodiment 6

FIG. 15 to FIG. 17 are step views showing another embodiment of the liquid crystal display device of the present invention, and correspond to the above-mentioned FIG. 13 and FIG. 14.

The steps shown in FIG. 15A to FIG. 15G are substantially equal to the steps shown in FIG. 13A to FIG. 13G. Accordingly, steps shown in FIG. 16A and drawings which follow FIG. 16A are explained sequentially.

Step 1. (FIG. 16A)

Using a photoresist film RST as a mask, a metal layer MTL2 is etched by wet etching thus forming gate electrodes (GTn, GTp). In this case, the metal layer MTL2 is etched by an approximately 1 μm with respect to the mask by side etching.

In a state that the photoresist film RST is allowed to remain as it is, the ion implantation of n-type impurity with high concentration is performed. In this case, the ion implantation is performed such that a peak depth reaches a position in the vicinity of an upper surface of the semiconductor layer PS(p) of the n-type thin film transistor nTFT. Accordingly, the semiconductor layer PS(p) of the n-type thin film transistor nTFT is doped with n-type impurity thus forming a drain region DD(n+) and a source region SD(n+). The drain region DD(n+) and the source region SD(n+) are formed in a spaced-apart manner from a region where the gate electrode GTn is formed as viewed in a plan view by a distance of approximately 1 μm.

Here, in a region where the p-type thin film transistor pTFT is formed, the n-type impurity passes through the semiconductor layer PS(n) of the p-type thin film transistor pTFT and remains in the background film GRL (indicated by a dotted line in the drawing).

Figure 16A:
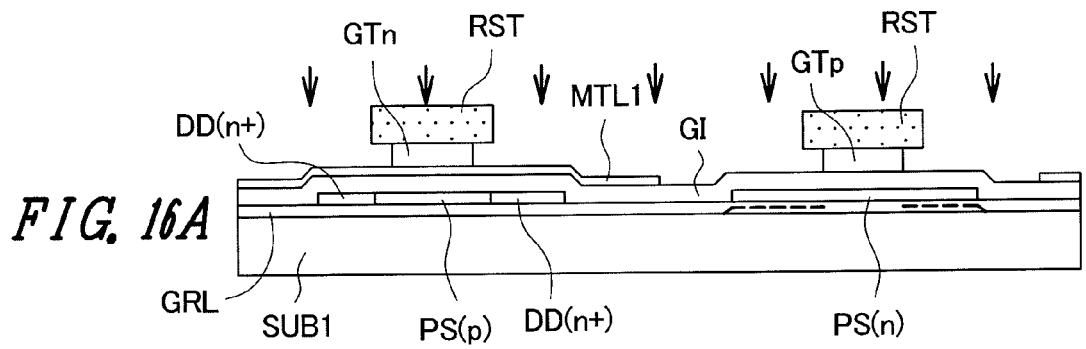
FIG. 16A to FIG. 16D are constitutional views showing another embodiment of the manufacturing method of the display device of the present invention which follows FIG. 15G.
Figure 16B:
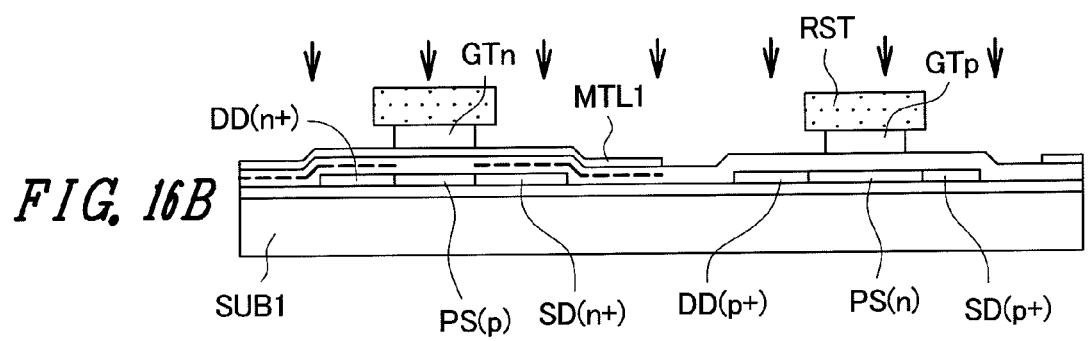

Step 2. (FIG. 16B)

In a state that the photoresist film RST is allowed to remain as it is, the ion implantation of p-type impurity with high concentration is performed. In this case, the ion implantation is performed such that a peak depth reaches a position in the vicinity of an upper surface of the semiconductor layer PS(n) of the p-type thin film transistor pTFT.

Accordingly, the semiconductor layer PS(n) of the p-type thin film transistor pTFT is doped with the p-type impurity thus forming a drain region DD(p+) and a source region SD(p+). The drain region DD(p+) and the source region SD(p+) are formed in a spaced-apart manner from a region where a gate electrode GTp is formed as viewed in a plan view by a distance of approximately 1 μm.

Here, in a region where the n-type thin film transistor nTFT is formed, the n-type impurity remains in an insulation film GI (indicated by a dotted line in the drawing).

Figure 16C:
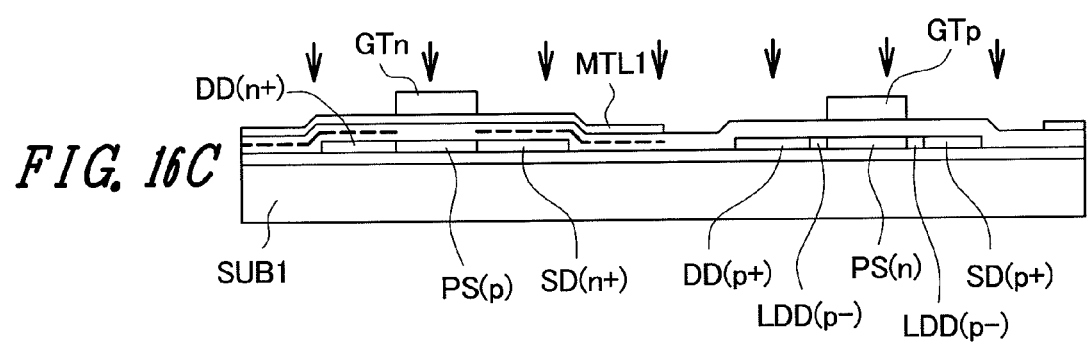

Step 3. (FIG. 16C)

The photoresist film RST is removed, and the ion implantation of p-type impurity with low concentration is performed. In this case, the ion implantation is performed such that a peak depth reaches a position in the vicinity of an upper surface of the semiconductor layer PS(n) of the p-type thin film transistor pTFT.

Accordingly, the semiconductor layer PS(n) of the p-type thin film transistor pTFT is doped with the p-type impurity thus forming an LDD layer LDD(p−) on a channel region side arranged adjacent to the drain region DD(p+) and on a channel region side arranged adjacent to the source region SD(p+) respectively.

Here, in the region where the n-type thin film transistor nTFT is formed, the p-type impurity remains in the insulation film GI (indicated by a dotted line in the drawing).

Figure 16D:
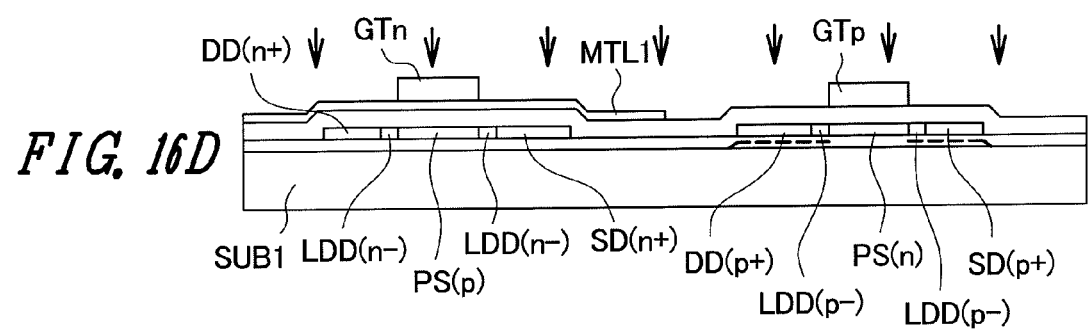

Step 4. (FIG. 16D)

The ion implantation of n-type impurity with low concentration is performed. In this case, the ion implantation is performed such that a peak depth reaches a position in the vicinity of an upper surface of the semiconductor layer PS(p) of the n-type thin film transistor nTFT.

Accordingly, the semiconductor layer PS(p) of the n-type thin film transistor nTFT is doped with the n-type impurity thus forming an LDD layer LDD(n−) on a channel region side arranged adjacent to the drain region DD(n+) and on a channel region side arranged adjacent to the source region SD(n+) respectively.

Here, in the region where the p-type thin film transistor nTFT is formed, the n-type impurity remains in a background film GRL (indicated by a dotted line in the drawing).

Figure 17A:
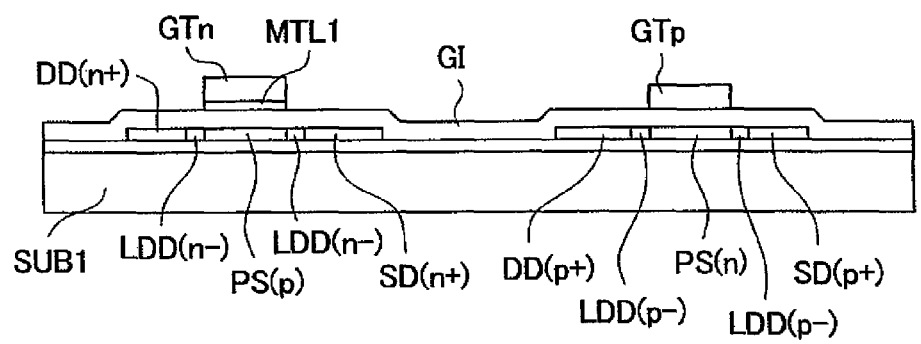
FIG. 17A and FIG. 17B are constitutional views showing another embodiment of the manufacturing method of the display device of the present invention which follows FIG. 16D.
Figure 17B:
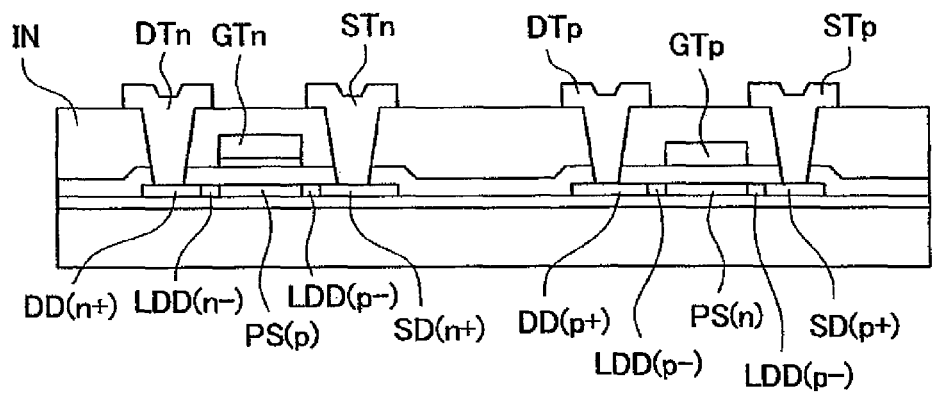

Thereafter, as shown in FIG. 17A, the metal layer MTL1 is etched using the gate electrode GTn as a mask thus forming, as shown in FIG. 17B, an interlayer insulation film IN, drain electrodes DTn, DTp and source electrodes STn, STp.

Embodiment 7

Figure 20A:
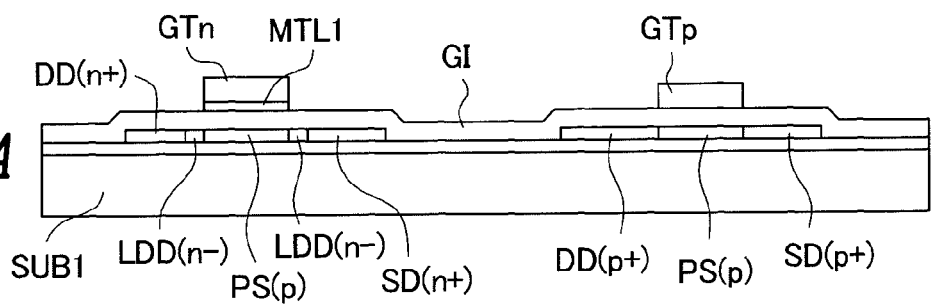
FIG. 20A and FIG. 20B are constitutional views showing another embodiment of the manufacturing method of the display device of the present invention which follows FIG. 19D.
Figure 20B:
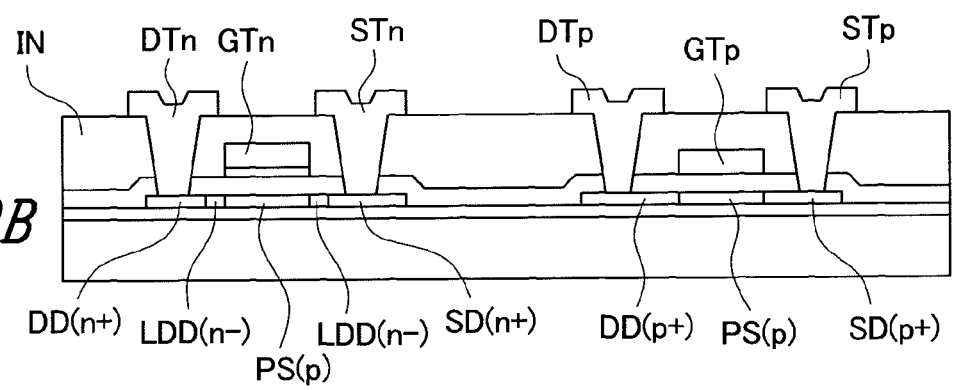
Figure 21A:
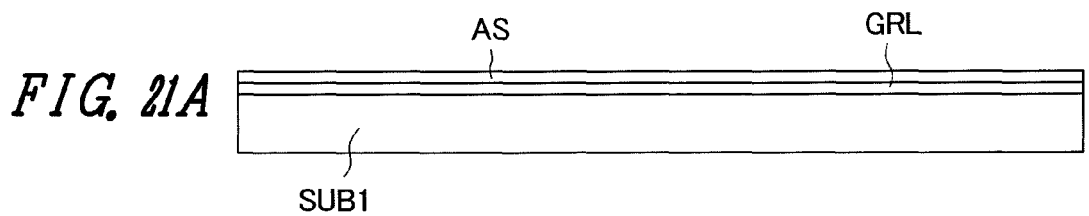
FIG. 21A to FIG. 21F are constitutional views showing another embodiment of the manufacturing method of the display device of the present invention.
Figure 21B:
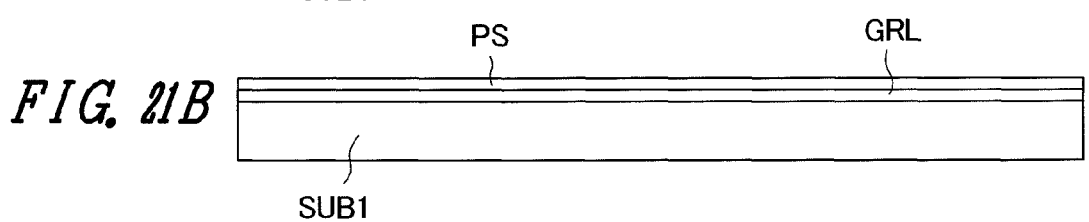
Figure 21C:
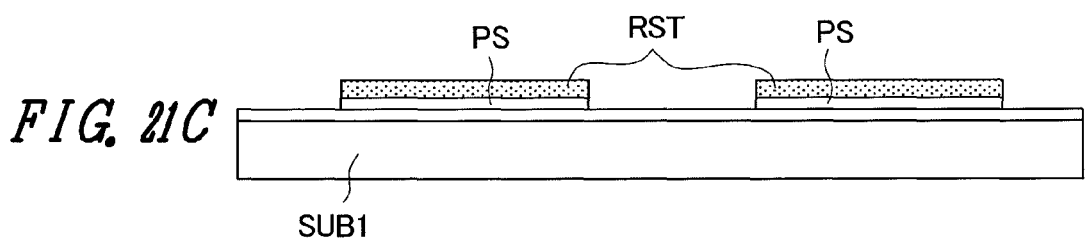
Figure 21D:
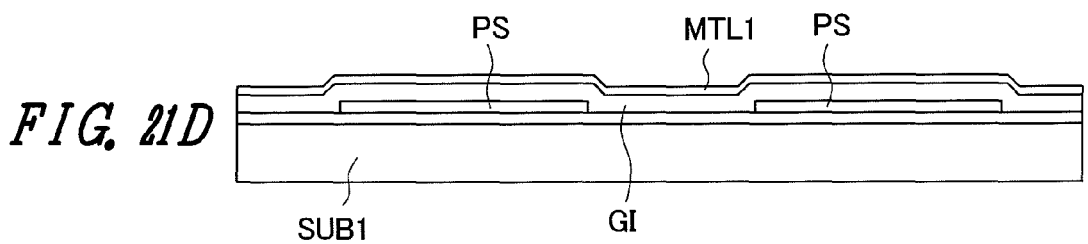
Figure 21E:
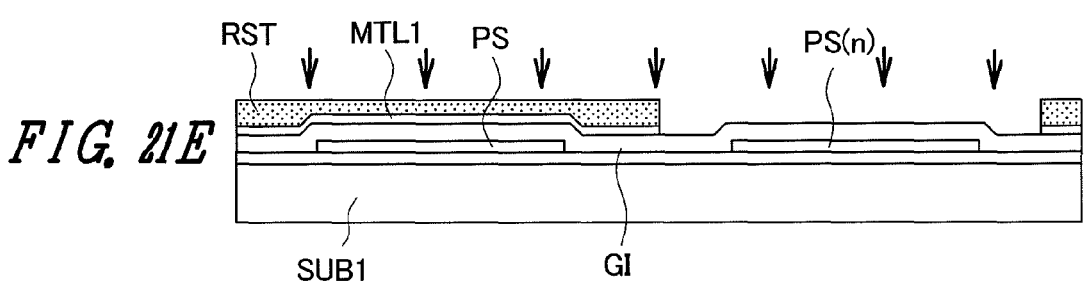
Figure 21F:
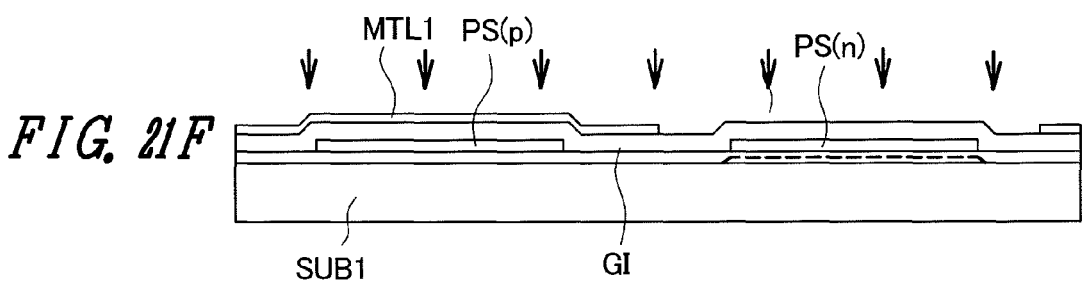

FIG. 18 to FIG. 20 are step views showing another embodiment of the manufacturing method of the display device according to the present invention, and these drawings correspond to FIG. 13 and FIG. 14.

In FIG. 18 to FIG. 20, this embodiment differs from the embodiment shown in FIG. 13 and FIG. 14 with respect to steps shown in FIG. 18A to FIG. 18F.

That is, this embodiment differs from the above-mentioned embodiment in steps in which a p-type semiconductor layer is formed in a region where an n-type thin film transistor is formed and an n-type semiconductor layer is formed in a region where a p-type thin film transistor is formed, an insulation film is formed over the p-type semiconductor layer and the n-type semiconductor layer, and a metal layer which has an opening in a region where the n-type thin film transistor is formed is formed on an upper surface of the insulation film.

Accordingly, in the explanation of this embodiment, the explanation is made with respect to only steps shown in FIG. 18A to FIG. 18F.

Figure 18A:
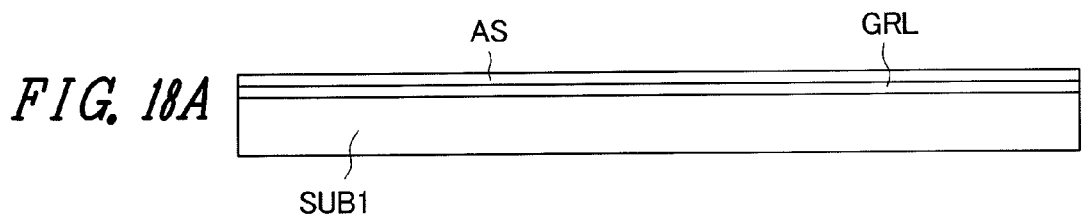
FIG. 18A to FIG. 18F are constitutional views showing another embodiment of the manufacturing method of the display device of the present invention.

Step 1. (FIG. 18A)

The substrate SUB1 is prepared, and the background film GRL made of SiN is formed over the substrate SUB1, for example. Further, an amorphous semiconductor layer AS made of amorphous Si is formed on a surface of the background film GRL.

Figure 18B:
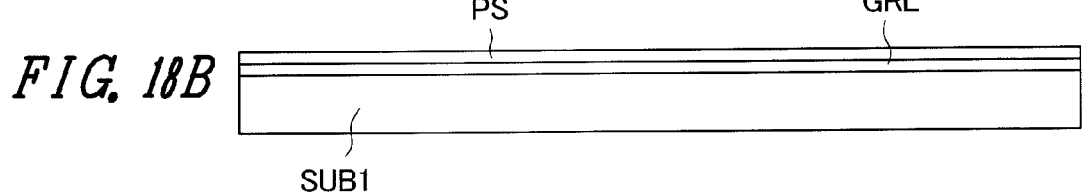

Step 2. (FIG. 18B)

By radiating laser beams generated by an excimer laser to the amorphous semiconductor layer AS, for example, the amorphous semiconductor layer AS is transformed into a poly-crystalline semiconductor layer PS made of poly-Si.

Figure 18C:
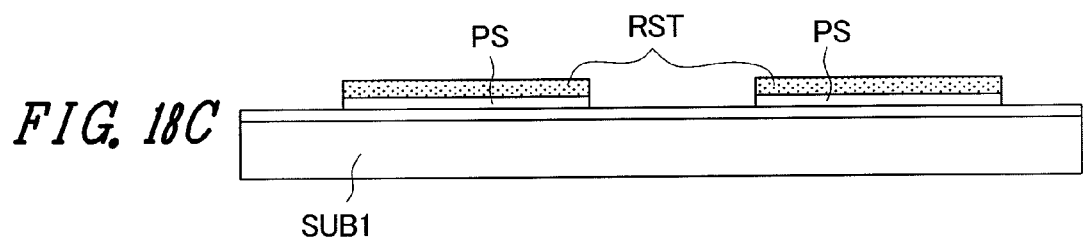

Step 3. (FIG. 18C)

A photoresist film RST is formed on the whole region of an upper surface of the poly-crystalline semiconductor layer PS. Then, the photoresist film RST is allowed to remain in a region where the semiconductor layer of the n-type thin film transistor nTFT is formed and a region where the semiconductor layer of the p-type thin film transistor pTFT is formed respectively using a photolithography technique.

Using the remaining photoresist film RST as a mask, the poly-crystalline semiconductor layer PS is etched to allow the poly-crystalline semiconductor layer PS to remain below the photoresist film RST.

Figure 18D:
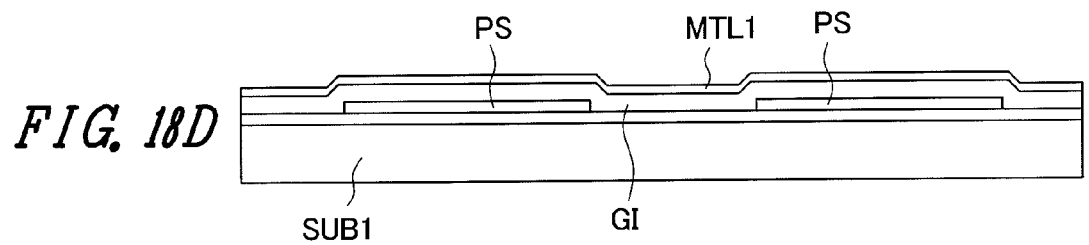

Step 4. (FIG. 18D)

The photoresist film RST is removed, and an insulation film GI made of $SiO_2$ is formed on the upper surface of the substrate SUB1 so as to cover the poly-crystalline semiconductor layer PS, for example.

A metal layer MTL1 made of titanium and having a film thickness of 30 to 50 nm is formed on the whole surface of the insulation film GI, for example.

Figure 18E:
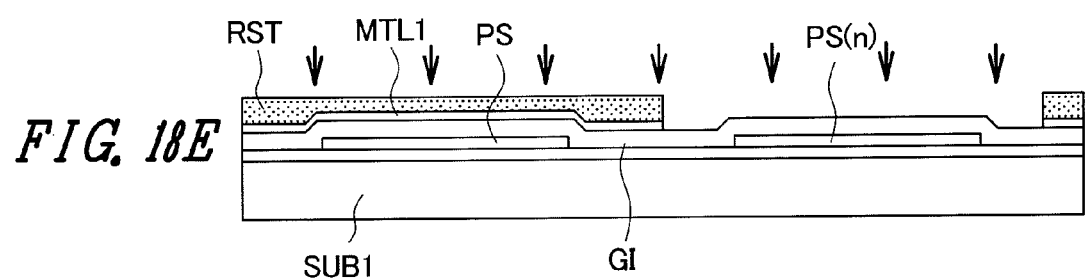

Step 5. (FIG. 18E)

The photoresist film RST is formed on the whole region of a surface of the metal layer MTL1, and the photoresist film RST in a region where the p-type thin film transistor pTFT is formed is removed using a photolithography technique.

Using the remaining photoresist film RST as a mask, the metal layer MTL1 is etched.

In a state that the photoresist film RST is allowed to remain as it is, the ion implantation of n-type impurity is performed. Accordingly, the semiconductor layer PS is formed into a semiconductor layer PS(n) which is doped with the n-type impurity.

Step 6. (FIG. 18F)

The photoresist film RST is removed, and the ion implantation of p-type impurity with low concentration is performed. In this case, the ion implantation is performed such that a peak depth reaches a position in the vicinity of an upper surface of the semiconductor layer PS of the n-type thin film transistor nTFT. Accordingly, the semiconductor layer PS is formed into a semiconductor layer PS(p) which is doped with the p-type impurity. Here, in the region where the p-type thin film transistor pTFT is formed, the p-type impurity remains in the background film GRL (indicated by a dotted line in the drawing).

Figure 18F:
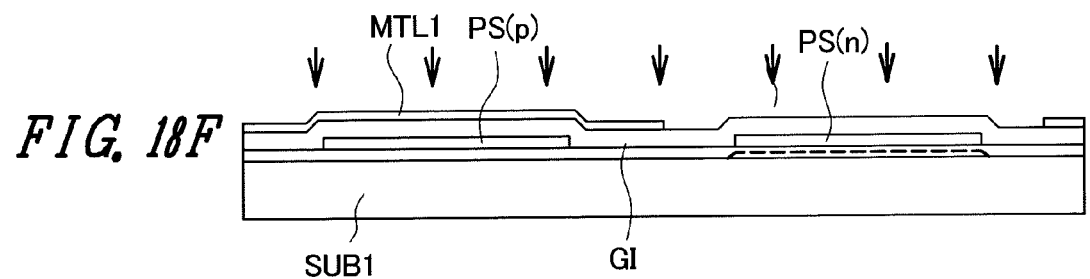
Figure 19A:
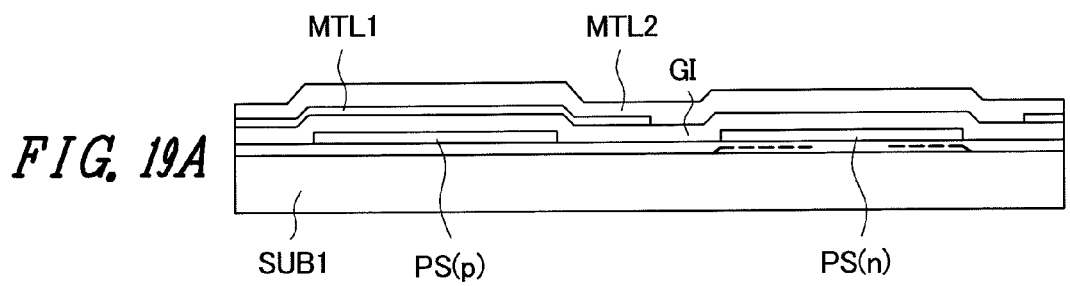
FIG. 19A to FIG. 19D are constitutional views showing another embodiment of the manufacturing method of the display device of the present invention which follows FIG. 18F.
Figure 19B:
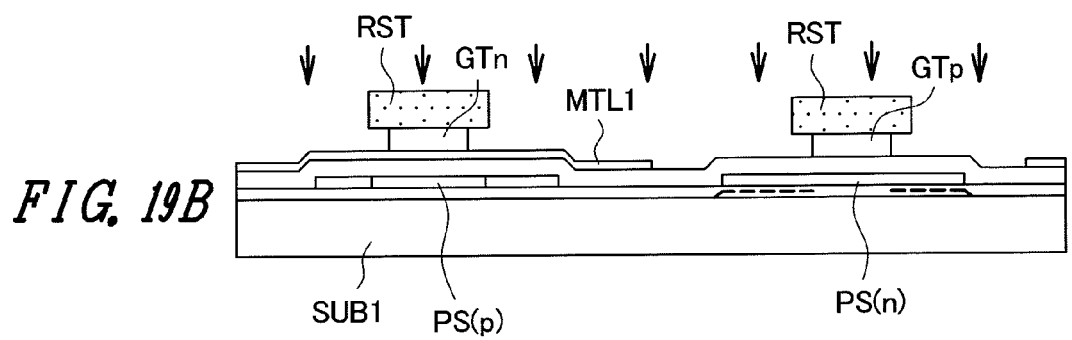
Figure 19C:
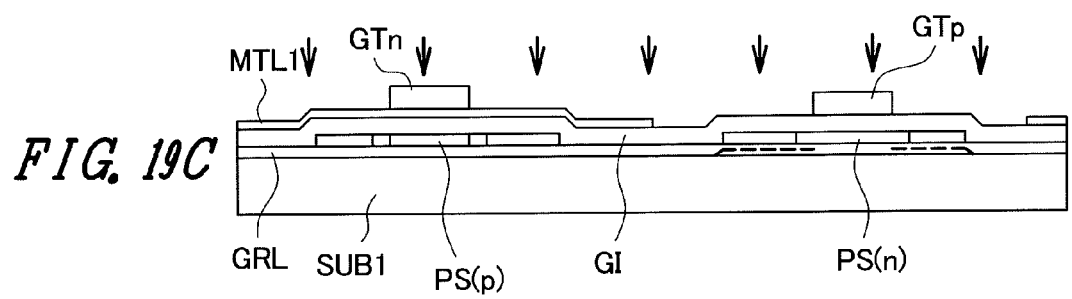
Figure 19D:
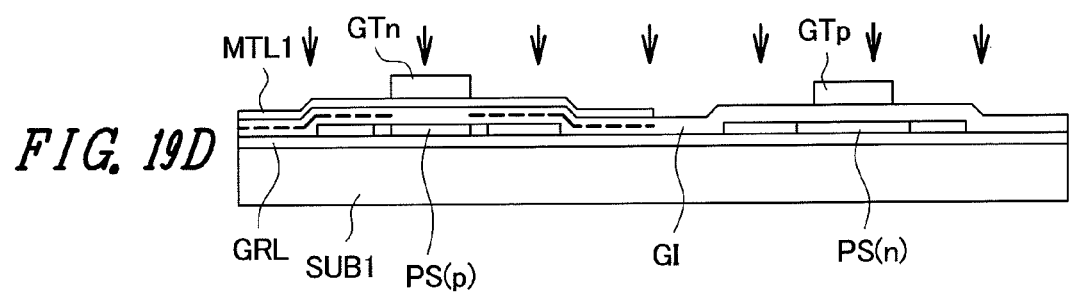

Steps which come after step 6 shown in FIG. 18F are substantially equal to the steps shown in FIG. 13G and drawings which follow FIG. 13G.

Embodiment 8

Figure 22A:
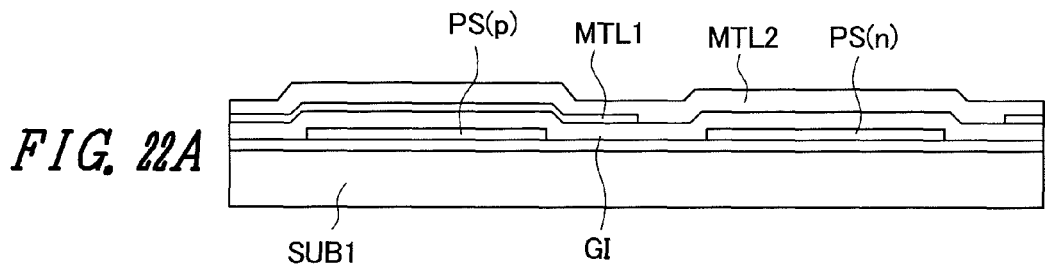
FIG. 22A to FIG. 22E are constitutional views showing another embodiment of the manufacturing method of the display device of the present invention which follows FIG. 21F.
Figure 22B:
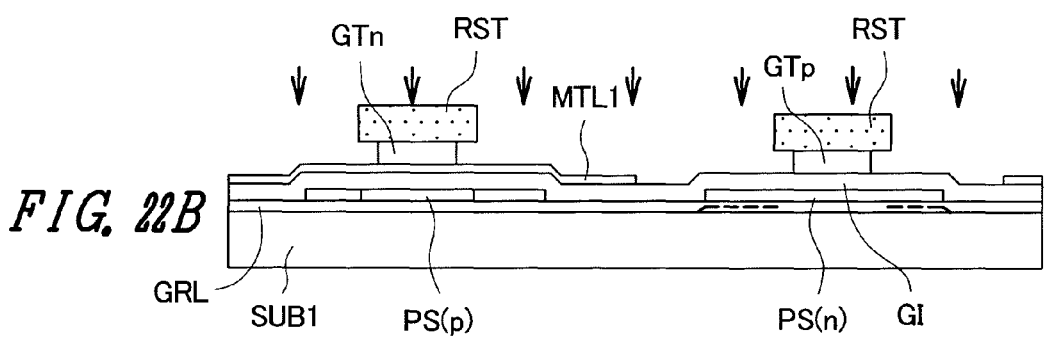
Figure 22C:
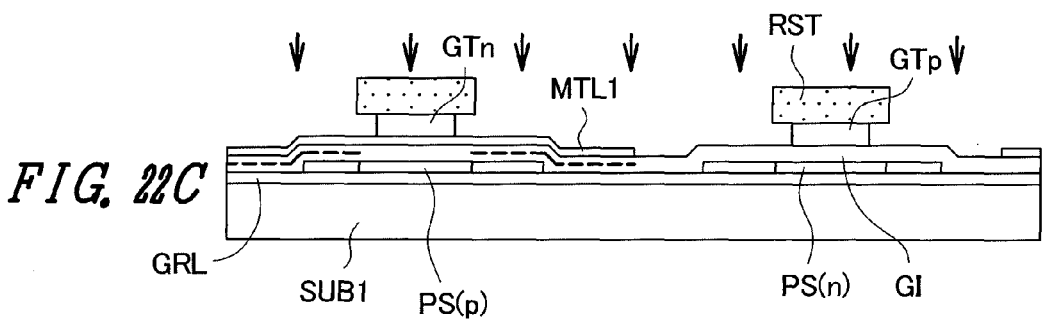
Figure 22D:
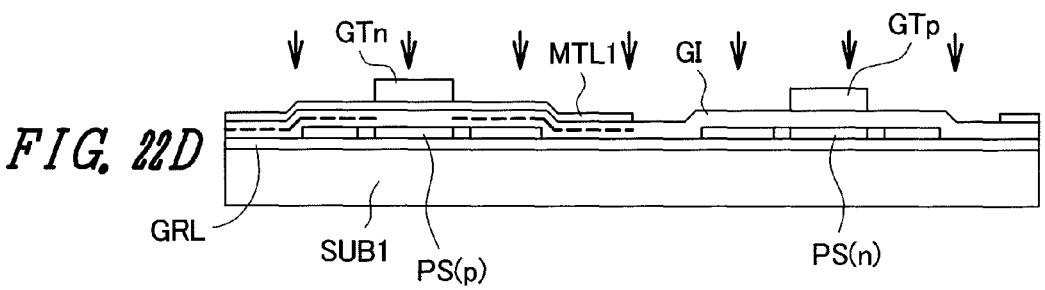
Figure 22E:
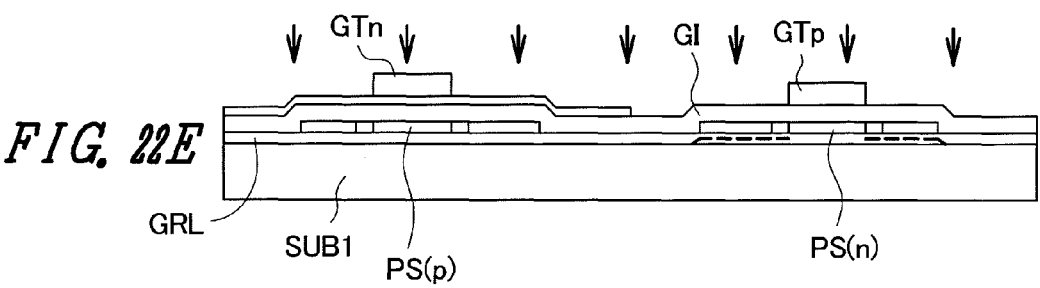
Figure 23A:
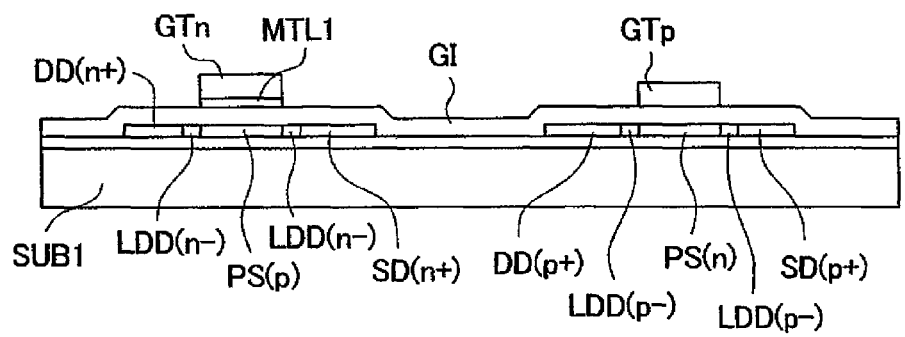
FIG. 23A and FIG. 23B are constitutional views showing another embodiment of the manufacturing method of the display device of the present invention which follows FIG. 22F.
Figure 23B:
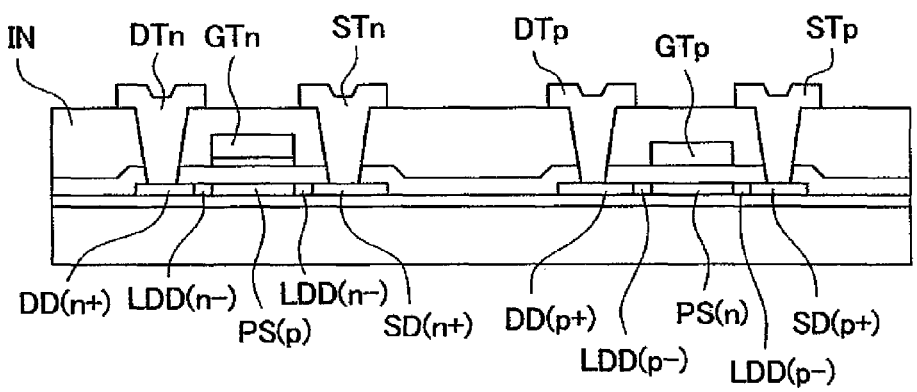

FIG. 21 to FIG. 23 are step views showing another embodiment of the manufacturing method of the display device according to the present invention, and these drawings correspond to FIG. 18 to FIG. 20.

FIG. 21A to FIG. 21F are substantially equal to FIG. 18A to FIG. 18F.

Figure 15A:
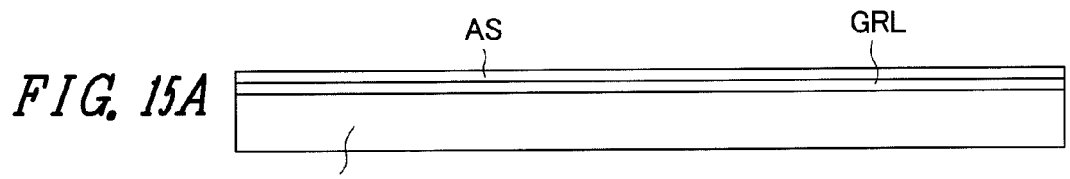
FIG. 15A to FIG. 15G are constitutional views showing another embodiment of the manufacturing method of the display device of the present invention.
Figure 15B:
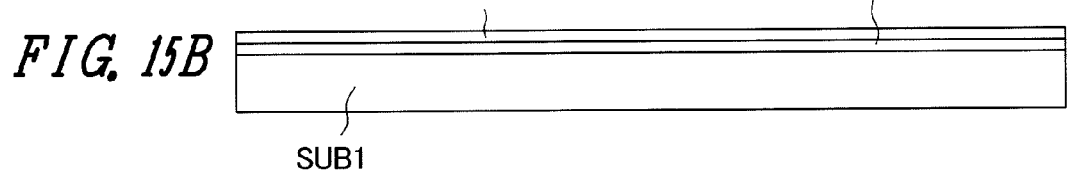
Figure 15C:
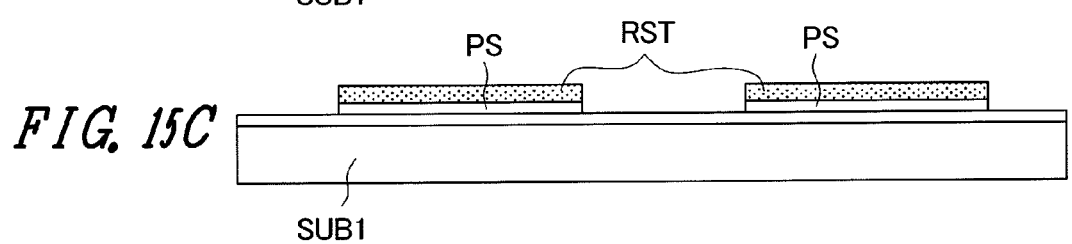
Figure 15D:
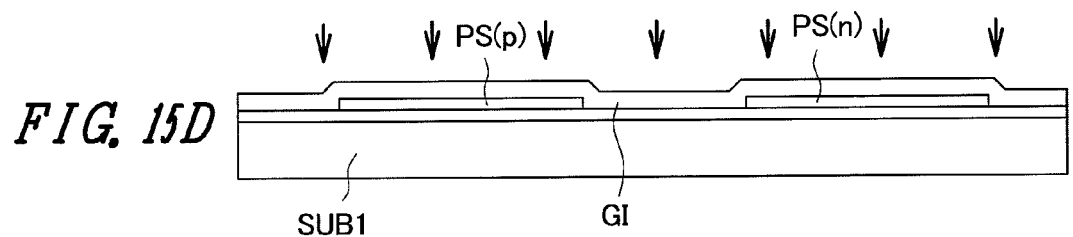
Figure 15E:
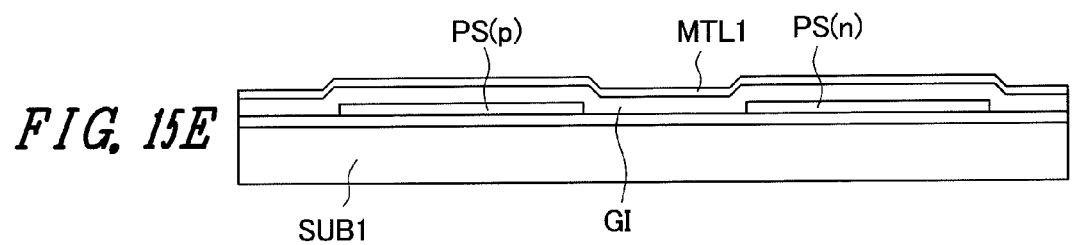
Figure 15F:
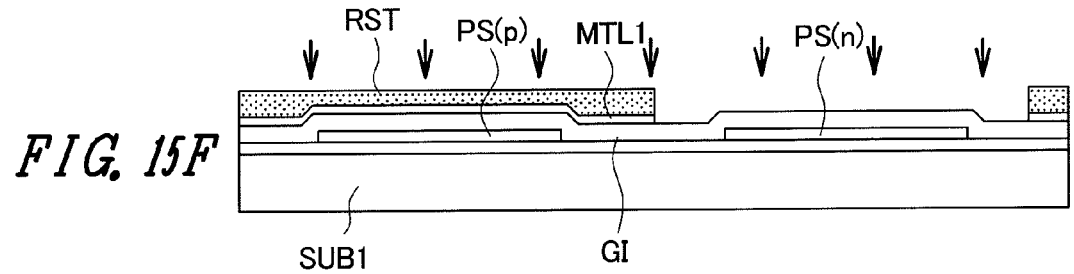
Figure 15G:
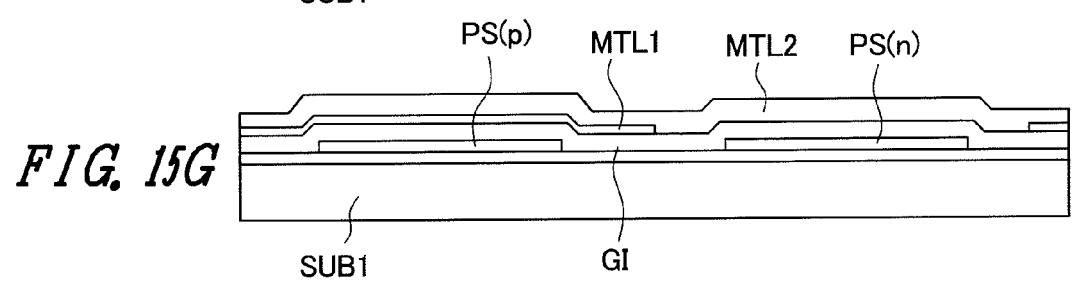

Further, steps which come after the step shown in FIG. 22A are substantially equal to the above-mentioned steps shown in FIG. 15G and drawings which follow FIG. 15G.

The embodiment 8 can also acquire the substantially same advantageous effects as the above-mentioned embodiments.

In the above-mentioned embodiments, the explanation has been made by taking the liquid crystal display device as an example of the display device. However, it is needless to say that the display device is not limited to the liquid crystal display device, and the display device may be other display device such as an organic EL display device, for example.

The above-mentioned respective embodiments may be used in a single form or in combination. This is because the advantageous effects of the respective embodiments can be acquired individually or synergistically.

What is claimed is:

1. A display device which includes a plurality of n-type thin film transistors and a plurality of p-type thin film transistors, wherein the n-type thin film transistor and the p-type thin film transistor respectively have a semiconductor layer, a gate insulation film and a gate electrode, the semiconductor layer includes a channel region, a source region and a drain region, the gate insulation film is formed over the semiconductor layer, the gate electrode is formed over the gate insulation film in a state that the gate electrode strides over the semiconductor layer, the gate electrode of one thin film transistor out of the n-type thin film transistor and the p-type thin film transistor forms a metal layer made of a material different from a material of the gate electrode on a gate-insulation-film side thereof, and at least one of the n-type thin film transistor and the p-type thin film transistor is configured such that a region which exhibits impurity concentration lower than the source region and the drain region is formed between the channel region and the source region and between the channel region and the drain region.

2. A display device according to claim 1, wherein the semiconductor layer is made of polysilicon.

3. A display device according to claim 1, wherein the metal layer is made of titanium.

* * * * *